United States Patent
Sayama

(10) Patent No.: US 8,742,497 B2
(45) Date of Patent: Jun. 3, 2014

(54) SEMICONDUCTOR DEVICE

(71) Applicant: Renesas Electronics Corporation, Kawasaki (JP)

(72) Inventor: Hirokazu Sayama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/861,005

(22) Filed: Apr. 11, 2013

(65) Prior Publication Data

US 2013/0277738 A1    Oct. 24, 2013

(30) Foreign Application Priority Data

Apr. 18, 2012  (JP) ................................. 2012-094401

(51) Int. Cl.
   *H01L 29/66*    (2006.01)

(52) U.S. Cl.
   USPC .................... 257/336; 257/344; 257/E27.063

(58) Field of Classification Search
   USPC ................................... 257/336, 344, E27.063
   See application file for complete search history.

(56) References Cited

U.S. PATENT DOCUMENTS

| | | | |
|---|---|---|---|
| 6,459,122 B2 | 10/2002 | Uno | |
| 6,759,895 B2 * | 7/2004 | Takami | 327/525 |
| 7,132,725 B2 * | 11/2006 | Iwabuchi | 257/492 |
| 7,227,226 B2 * | 6/2007 | Kawamura | 257/332 |
| 8,362,554 B2 * | 1/2013 | Matsudai et al. | 257/336 |
| 2010/0085109 A1 * | 4/2010 | Okanobu | 327/534 |
| 2011/0233668 A1 | 9/2011 | Obatake et al. | |

FOREIGN PATENT DOCUMENTS

JP    2002-043571 A    2/2002
JP    2011-204924 A    10/2011

* cited by examiner

*Primary Examiner* — Trung Q Dang
(74) *Attorney, Agent, or Firm* — Sughrue Mion, PLLC

(57) ABSTRACT

A semiconductor device is provided, in which work of a parasitic bipolar transistor can be suppressed and a potential difference can be provided between a source region and a back gate region. A high voltage tolerant transistor formed over a semiconductor substrate includes: a well region of a first conductivity type; a first impurity region as the source region; and a second impurity region as a drain region. The semiconductor device further includes a third impurity region and a gate electrode for isolation. The third impurity region is formed, in planar view, between a pair of the first impurity regions, and from which a potential of the well region is extracted. The gate electrode for isolation is formed over the main surface between the first impurity region and the third impurity region.

7 Claims, 24 Drawing Sheets

HIGH VOLTAGE TOLERANT nMOSFET FORMATION REGION

SEMICONDUCTOR DEVICE

CROSS-REFERENCE TO RELATED APPLICATIONS

The disclosure of Japanese Patent Application No. 2012-094401 filed on Apr. 18, 2012 including the specification, drawings and abstract is incorporated herein by reference in its entirety.

BACKGROUND

The present invention relates to a semiconductor device, which can be preferably used as a semiconductor device housing, for example, a high voltage tolerant transistor.

In a semiconductor device having a MOSFET (Metal Oxide Semiconductor Field Effect Transistor), a so-called back gate region, from which a potential of a semiconductor substrate or a well region is extracted, may be formed. Semiconductor devices in each of which the back gate region is formed are disclosed in, for example, Japanese Unexamined Patent Publication No. 2002-43571 (Patent Document 1) and Japanese Unexamined Patent Publication No. 2011-204924 (Patent Document 2).

[Patent Document 1] Japanese Unexamined Patent Publication No. 2002-43571
[Patent Document 2] Japanese Unexamined Patent Publication No. 2011-204924

SUMMARY

In the semiconductor device disclosed in each of Patent Documents 1 and 2, the distance between a back gate region and a transistor main body is small, and hence it is thought that work of a parasitic bipolar transistor can be suppressed and a decrease in the on-state breakdown voltage of the transistor can be suppressed. In this case, however, a short circuit between a source region and the back gate region in the transistor is likely to occur. In particular, in a back contact structure that forms the back gate region disclosed in Patent Document 2, a potential difference cannot be provided between a source region and the back gate region (back contact structure). Accordingly, there is the possibility that normal work of the semiconductor device may be hampered.

Other problems and new features will become clear from the description and accompanying drawings of the present specification.

According to an embodiment, a semiconductor device including a high voltage tolerant transistor has the following structure. The high voltage tolerant transistor includes: a well region of a first conductivity type; a first impurity region as a source region; and a second impurity region as a drain region. The aforementioned semiconductor device further includes a third impurity region and a gate electrode for isolation. The third impurity region is formed, in planar view, between a pair of the first impurity regions, and from which a potential of the well region is extracted. The gate electrode for isolation is formed over a main surface between the first impurity region and the third impurity region.

According to another embodiment, a semiconductor device including a high voltage tolerant transistor has the following structure. The high voltage tolerant transistor includes: a well region of a first conductivity type; a first impurity region as a source region, and a second impurity region as a drain region. The aforementioned semiconductor device further includes a third impurity region and an insulating film for isolation. The third impurity region is formed, in planar view, between a pair of the first impurity regions, and from which a potential of the well region is extracted. The insulating film for isolation is formed over a main surface between the first impurity region and the third impurity region. A plurality of the insulating films for isolation are arranged to be spaced apart from each other in a direction intersecting, in planar view, with a direction along which the first impurity region and the second impurity region are brought together.

Advantage of the Invention

According to the embodiments, work of a parasitic bipolar transistor can be suppressed and a potential difference can be provided between the first impurity region and the third impurity region, while an influence on the high voltage tolerant transistor is being reduced to a minimum level.

DETAILED DESCRIPTION

Hereinafter, preferred embodiments will be described based on the accompanying drawings.

First Embodiment

Arrangement of each element formation region over a main surface of a semiconductor substrate according to the present embodiment will be first described with reference to FIG. 1.

Figure 1:
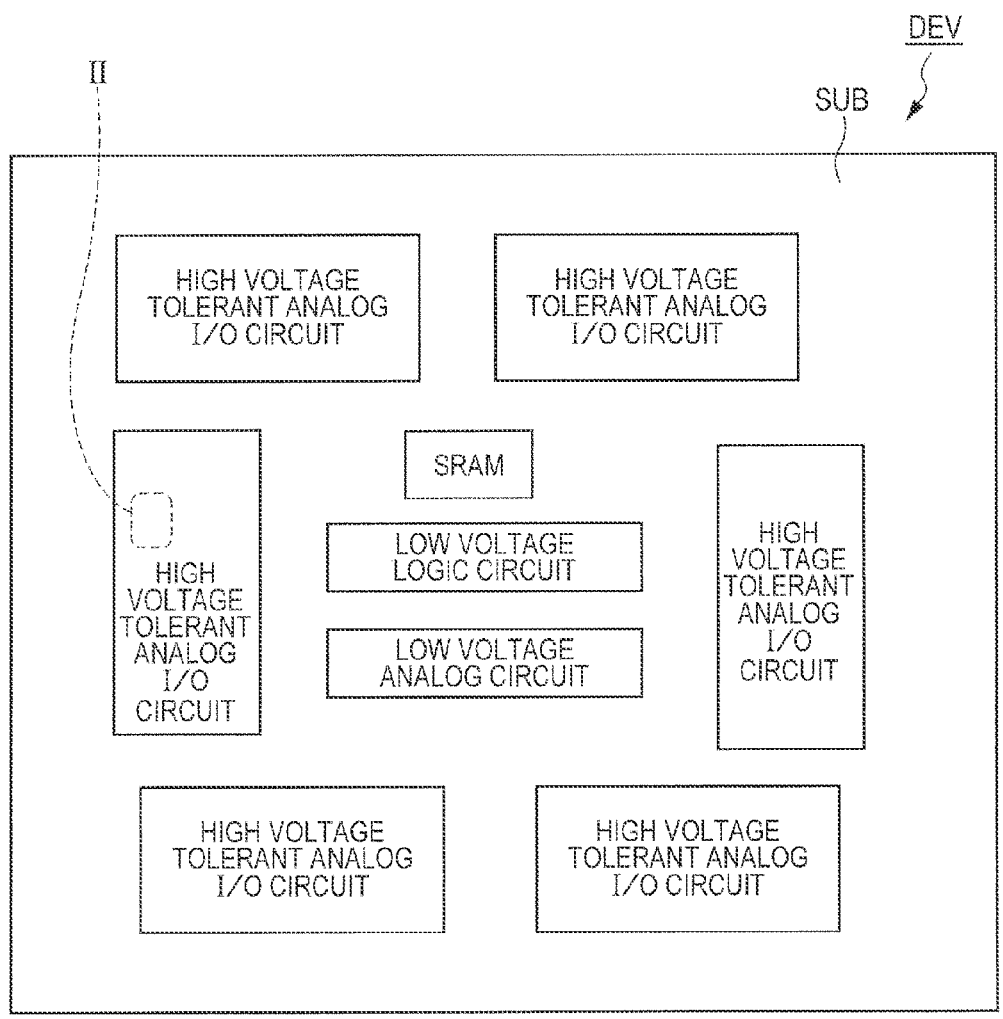
FIG. 1 is a schematic plan view of a semiconductor device according to First Embodiment.

With reference to FIG. 1, a semiconductor device DEV according to the present embodiment has, over a main surface of a semiconductor substrate SUB, for example, a high voltage tolerant analog I/O circuit formation region, a low voltage logic circuit formation region, a low voltage analog circuit formation region, and a so-called SRAM (Static Random Access Memory) formation region.

The aforementioned high voltage tolerant analog I/O circuit means a circuit for inputting/outputting an electrical signal between a power supply circuit, which can be used by applying a drive voltage higher than usual, and a low voltage logic circuit, etc. The low voltage logic circuit means a circuit having a control circuit, such as, for example, a logic circuit formed by a plurality of MIS transistors, etc., to perform calculations by using a digital signal. The low voltage analog circuit means a circuit that works with a voltage as low as that of the low voltage logic circuit but performs calculations by using an analog signal. The SRAM includes a plurality of MIS transistors and is used, in the semiconductor device, as a memory element for storing data. In addition to these regions, the semiconductor device also has, for example, a non-illustrated power supply circuit formation region, etc. The power supply circuit is used to supply a power supply voltage for activating each of the aforementioned circuits.

Figure 2:
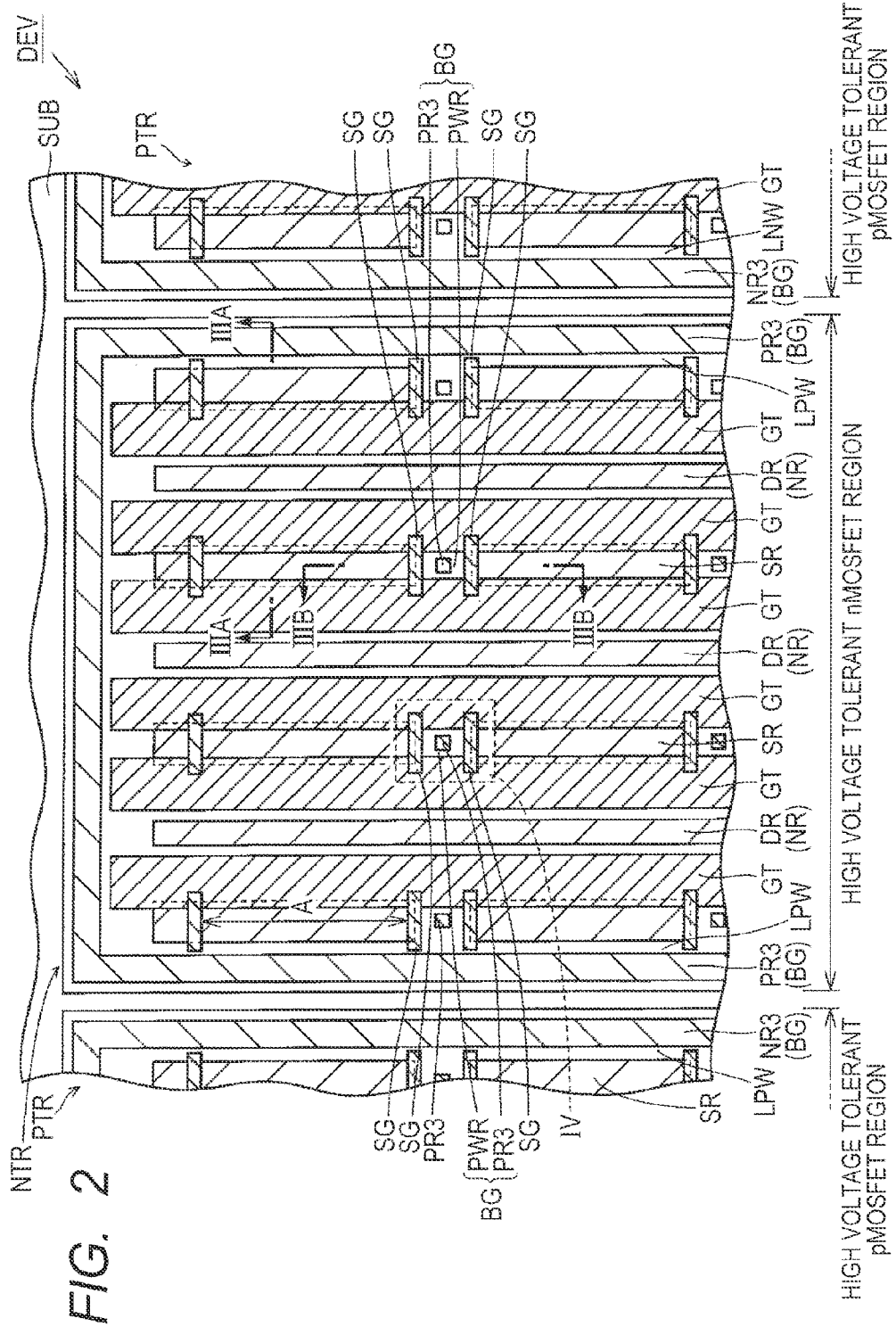
FIG. 2 is a schematic plan view illustrating the structure of each of a high voltage tolerant nMOSFET and a high voltage tolerant pMOSFET formed in the semiconductor device according to First Embodiment.

FIG. 2 is a schematic plan view illustrating the structure of a high voltage tolerant analog I/O circuit in the region "II" enclosed by the dotted line in FIG. 1. With reference to FIG. 2, for example, regions in each of which a high voltage tolerant pMOSFET is formed (high voltage tolerant pMOSFET regions) and regions in each of which a high voltage tolerant nMOSFET is formed (high voltage tolerant nMOSFET regions) are arranged so as to be alternately adjacent to each other, in the high voltage tolerant analog I/O circuit illustrated in FIG. 1, in the semiconductor device DEV formed over the semiconductor substrate SUB. Herein, the high voltage tolerant pMOSFET (or nMOSFET) means a p-channel (or n-channel) type MOS transistor that has a high drain withstand voltage of, for example, 10 V or higher.

An n-type transistor NTR as the high voltage tolerant nMOSFET is formed in the high voltage tolerant nMOSFET region. The n-type transistor NTR has a source region SR, a drain region DR, and a gate electrode GT. Each of the source region SR (comprised of an n-type impurity region), the drain region DR (comprised of an n-type impurity region NR), and the gate electrode GT has a lengthy rectangular shape extending in one direction along the main surface of the semiconductor substrate SUB (vertical direction in FIG. 2). A plurality of the source regions SR, a plurality of the drain regions DR, and a plurality of the gate electrodes GT are arranged to be spaced apart from each other in a direction (horizontal direction in FIG. 2) intersecting with the direction in which they extend.

The source region SR extends almost in parallel with the gate electrode GT and the drain region DR. In other words, the source region SRs are arranged so as to face each other in a direction intersecting with the direction in which the drain region DR extends. However, a length of the source region SR, across which the source region SR extends, is smaller than that of the drain region DR, and the source region SR is divided at a portion of an area that faces the drain region DR. Accordingly, a plurality of (two or more of) the source regions SR are aligned so as to be spaced apart from each other in the direction in which the drain region DR extends and so as to be almost parallel with the direction in which the drain region DR extends. Each of the source regions SR, which are thus aligned so as to be almost parallel with the direction in which the drain region DR extends, shares the identical gate electrode GT and the drain region DR, thereby allowing n-type transistors NTR, the number of which is equal to the number of the source regions SR that are aligned, to be formed.

A back gate region BG is formed, of the source regions SR, between a pair of the source regions SR that are adjacent to each other in planar view. The back gate region BG is formed by a p-type diffused region PR3 and a p-type well contact region PWR (in particular, one located near to the p-type diffused region PR3).

A gate electrode for isolation SG is arranged between the source region SR and the p-type diffused region PR3. This gate electrode for isolation SG has a function of electrically insulating (isolating) the source region SR and the p-type diffused region PR3 (back gate region BG) by being arranged between the source region SR and the p-type diffused region PR3 (located in the back gate region BG arranged between a pair of the source regions SR that are adjacent to each other in planar view).

The gate electrode for isolation SG is formed so as to couple (bridge) a pair of the adjacent gate electrodes GT together. More specifically, the gate electrode for isolation SG extends in a direction (horizontal direction in FIG. 2) intersecting with the direction (vertical direction in FIG. 2) in which each of the pair of the gate electrodes GT extends, and is formed so as to be coupled to each of the pair of the adjacent gate electrodes GT.

The gate electrode for isolation SG is arranged between the two source regions SR, a plurality of (two or more of) the source regions SR being aligned in the direction in which the drain region extends. Accordingly, a plurality of the gate electrodes for isolation SG are arranged to be spaced apart from each other in the direction in which the drain region DR extends (i.e., the vertical direction in FIG. 2 that intersects with a direction along which the source region SR and the drain region DR are brought together).

A p-type diffused region PR3 is formed so as to enclose, for example, in a rectangular shape in planar view, the region where the n-type transistors NTR are arranged. Similarly to the aforementioned p-type diffused regions PR3 in the back gate region BG arranged between a pair of the adjacent source regions SR, this p-type diffused region PR3 is formed over the main surface in a p-type well region LPW. In this sense, this p-type diffused region PR3 (and the p-type well region LPW located near thereto) may be considered as the back gate region BG.

A p-type transistor PTR as the high voltage tolerant pMOSFET is formed in the high voltage tolerant pMOSFET region. The p-type transistor PTR is comprised of a source region SR (comprised of a p-type impurity region), a drain region DR (comprised of a p-type impurity region), and a gate region GT, which are arranged in the same way as in the n-type transistor NTR. In addition, an n-type diffused region NR3 is formed so as to enclose, for example, in a rectangular shape in planar view, a region where a plurality of the p-type transistors PTR are arranged. The aforementioned n-type diffused region NR3 in the high voltage tolerant pMOSFET region is formed over the main surface in an n-type well region LNW, and this region NR3 (including also the n-type well region LNW located near thereto) may be considered as a back gate region BG.

Figure 3A:
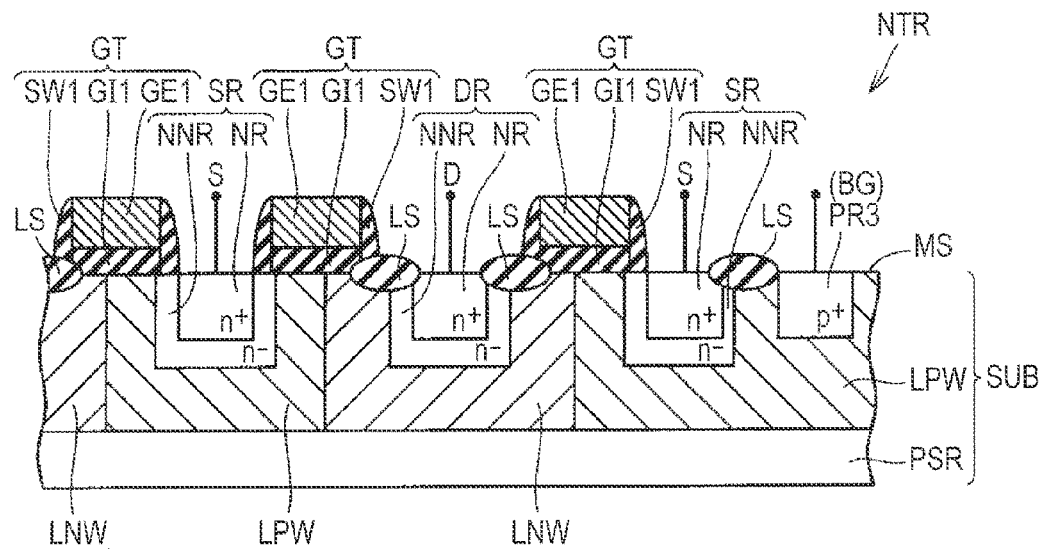
FIGS. 3A and 3B are schematic sectional views illustrating the structures of the high voltage tolerant nMOSFET and the high voltage tolerant pMOSFET formed in the semiconductor device according to First Embodiment.
Figure 3B:
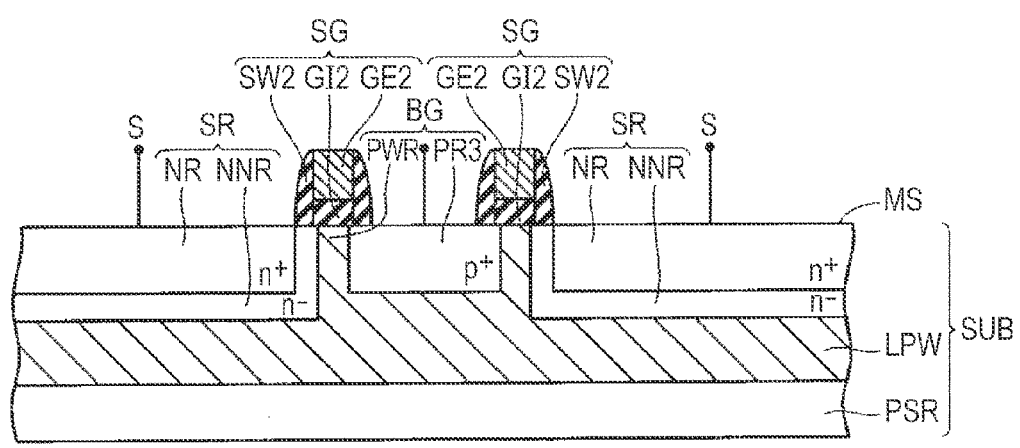
Figure 4:
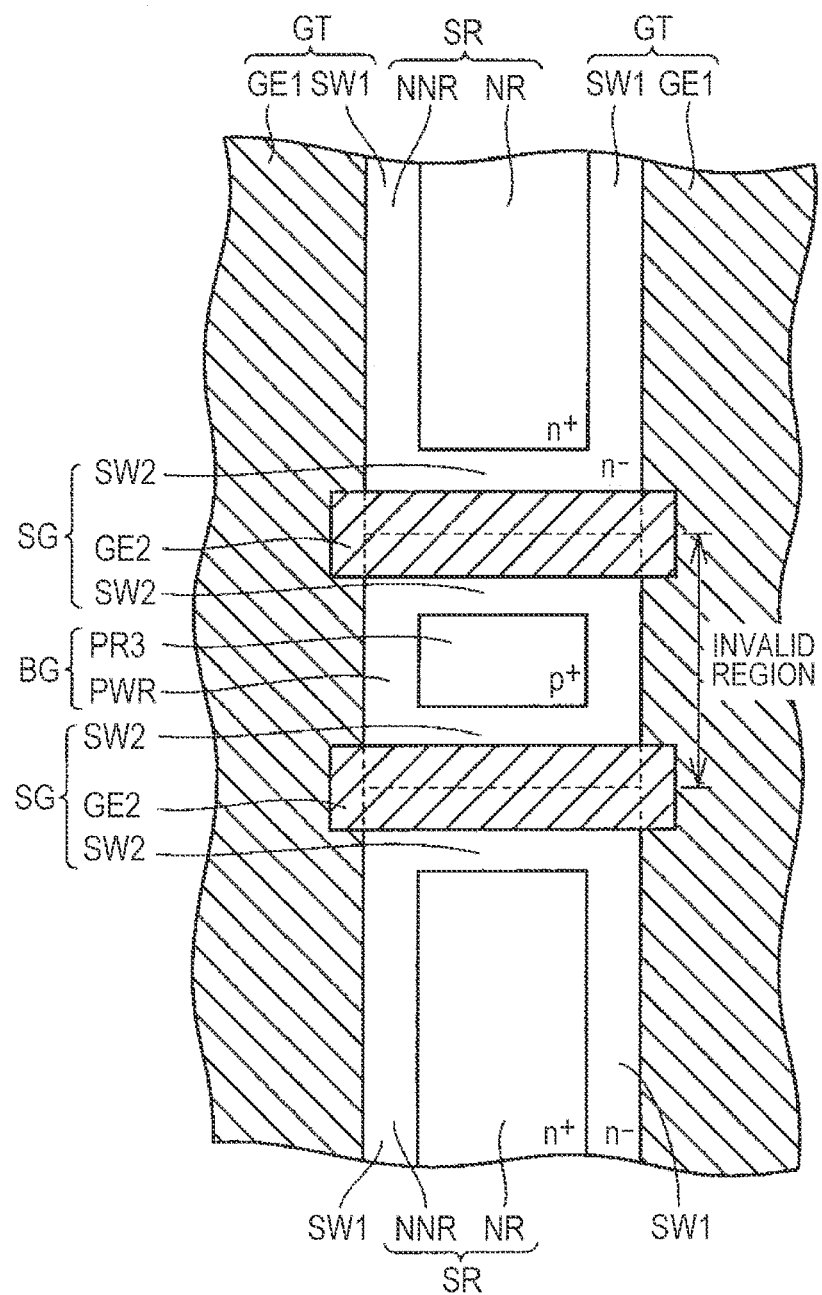
FIG. 4 is a schematic enlarged plan view illustrating a first example of the structure of each of a back gate region and a gate region for isolation according to First Embodiment.

FIG. 3A is a schematic sectional view of a portion along IIIA-IIIA Line in FIG. 2, while FIG. 3B is a schematic sectional view of a portion along IIIB-IIIB Line in FIG. 2. FIG. 4 is a partial enlarged plan view of the region IV rectangularly enclosed by the dotted line in FIG. 2, in which the structure in the region IV in FIG. 2, which is simplified for easy understanding thereof, is illustrated in a more accurate and enlarged way.

With reference to FIG. 3A, the n-type transistor NTR formed in the high voltage tolerant nMOSFET region is formed over the semiconductor substrate SUB that is comprised of, for example, single crystals of silicon and has a p-type region PSR including a p-type impurity. The n-type transistor NTR mainly has a p-type well region LPW (well region of a first conductivity type), a source region SR (first impurity region), a drain region DR (second impurity region), a gate electrode GT, and an element isolation insulating film LS.

The p-type well region LPW is a region containing a p-type impurity, which is formed over a main surface MS of the semiconductor substrate SUB in the p-type region PSR.

The source region SR is an impurity region formed to extract a source electrode S. The source region SR is formed over the main surface MS of the semiconductor substrate SUB in the p-type well region LPW, and is formed by an n-type impurity region NR and a low-concentration n-type region NNR. That is, each of the n-type impurity region NR and the low-concentration n-type region NNR is a region containing an n-type impurity and is formed over the main surface MS of the semiconductor substrate SUB (in the p-type well region LPW). It is preferable that the n-type impurity region NR is formed in the low-concentration n-type region NNR. Further, it is preferable that the n-type impurity concentration of the low-concentration n-type region NNR is lower than that of the n-type impurity region NR.

The drain region DR is an impurity region formed to extract a drain electrode D. The drain region DR is formed over the main surface MS of the semiconductor substrate SUB so as to be adjacent to the source region SR. Similarly to the source region SR, the drain region DR is formed by an n-type impurity region NR and a low-concentration n-type region NNR.

The drain region DR is formed over the main surface MS of the semiconductor substrate SUB in the n-type well region LNW. The n-type well region LNW is formed over the main surface MS of the semiconductor substrate SUB so as to be adjacent to the p-type well region LPW in the sectional view of FIG. 3A. Herein, the expression of "being adjacent" means being arranged side by side so as to be in contact.

With the n-type well region LNW, it can be suppressed that a failure, occurring due to an abnormal rise in an electric field near to the drain region DR in the high voltage tolerant n-type transistor NTR, may be caused. Herein, the drain region DR may be considered to be a region including the n-type regions NR and NNR and the n-type well region LNW, or may be considered to be a region including the n-type regions NR and NNR, extruding the n-type well region LNW. For example, the schematic plan view of FIG. 2 illustrates, as the drain region DR, a region from which the n-type well region LNW is excluded.

It is preferable that the impurity concentration of the low-concentration n-type region NNR is higher than that of the n-type well region LNW and lower than that of the n-type impurity region NR.

The gate electrode GT is formed over the main surface MS of the semiconductor substrate SUB so as to stretch over the source region SR and the drain region DR. The gate electrode GT is formed by: a gate insulating film GI1 comprised of, for example, a silicon dioxide film; a gate voltage application part GE1 for applying a voltage; and a sidewall insulating film SW1, comprised of, for example, a silicon dioxide film.

With reference to FIGS. 3B and 4, of a plurality of the source regions SR that are aligned, in planar view, in the direction in which the drain region DR extends, a back gate region BG is formed between a pair of the source regions SR. The back gate region BG between the pair of the source regions SR has a p-type diffused region PR3 (third impurity region) and a p-type well contact region PWR.

The p-type diffused region PR3 is a region from which a potential of the p-type well region LPW is extracted, and is formed over the main surface MS of the semiconductor substrate SUB in the p-type well region LPW. It is preferable that the p-type diffused region PR3 is formed by a certain concentration of p-type impurities, which is higher than that of the p-type well region LPW.

Similarly to the p-type diffused region PR3 between a pair of the source regions SR, a p-type diffused region PR3 (as the back gate region BG) that encloses, when viewed from above, the outer periphery of the high voltage tolerant nMOSFET (see FIGS. 2 and 3A) is also a region from which a potential of the p-type well region LPW is extracted.

In the present embodiment, the p-type well contact region PWR is part of the p-type well region LPW, as illustrated in FIG. 3B. The back gate region BG having a structure of being sandwiched by a pair of the source regions SR has such a structure in order to contact each of the pair of the source regions SR. The back gate region BG thus formed between a pair of the source regions SR is a back gate region formed so as to contact an impurity region having a polarity (n-type) opposite to that (p-type) of the impurity in the back gate region BG itself, and has a so-called back contact structure.

A gate electrode for isolation SG is formed over the main surface MS of the semiconductor substrate SUB between each of a pair of the adjacent source regions SR and the p-type diffused region PR3 between the pair of the source regions SR. The gate electrode for isolation SG is formed by: a gate insulating film GI2 comprised of, for example, a silicon dioxide film; a gate voltage application part GE2 for applying a voltage; and a sidewall insulating film SW2 comprised of, for example, a silicon dioxide film. Accordingly, the gate electrode for isolation SG has almost the same structure as that of the gate electrode GT.

Still referring to FIGS. 3B and 4, it is preferable that the gate electrode for isolation SG is formed so as to stretch, in planar view, over part of the source region SR and part of the back gate region BG. With such a structure, it becomes possible to efficiently extract a source electrode from the source region SR (n-type impurity region NR) and to efficiently extract an electrode of the p-type well region LPW from the back gate well region (p-type well contact region PWR). As an example, in the plan view of FIG. 4, the low-concentration n-type region NNR is mostly overlapped with the sidewall insulating films SW1 and SW2.

In FIG. 3B, the width of the p-type diffused region PR3 in the direction along the main surface MS is larger than that in FIG. 4. This is because FIG. 3B illustrates the p-type diffused region PR3 in accordance with the width of a lower portion thereof, which becomes larger than the width of the top portion thereof due to a heat treatment, while FIG. 4 illustrates only the top portion of the p-type diffused region PR3.

In FIG. 4, the gate electrode for isolation SG is formed, over the top surface of the p-type diffused region PR3 (main surface MS), so as to stretch over the source region SR and the p-type well contact region PWR. However, the gate electrode for isolation SG may be formed so as to stretch over the source region SR and part of the p-type diffused region PR3.

It is preferable that the gate electrode for isolation SG is formed so as to extend in a direction (horizontal direction in FIG. 4) intersecting with the direction in which the source region SR extends and so as to be coupled to a pair of the gate electrodes GT arranged on both left and right sides of the source region SR. Accordingly, it is preferable that the gate electrode for isolation SG is electrically coupled to the pair of gate electrodes GT arranged on both left and right sides of the source region SR that is arranged immediately under the gate electrode for isolation SG.

Figure 5:
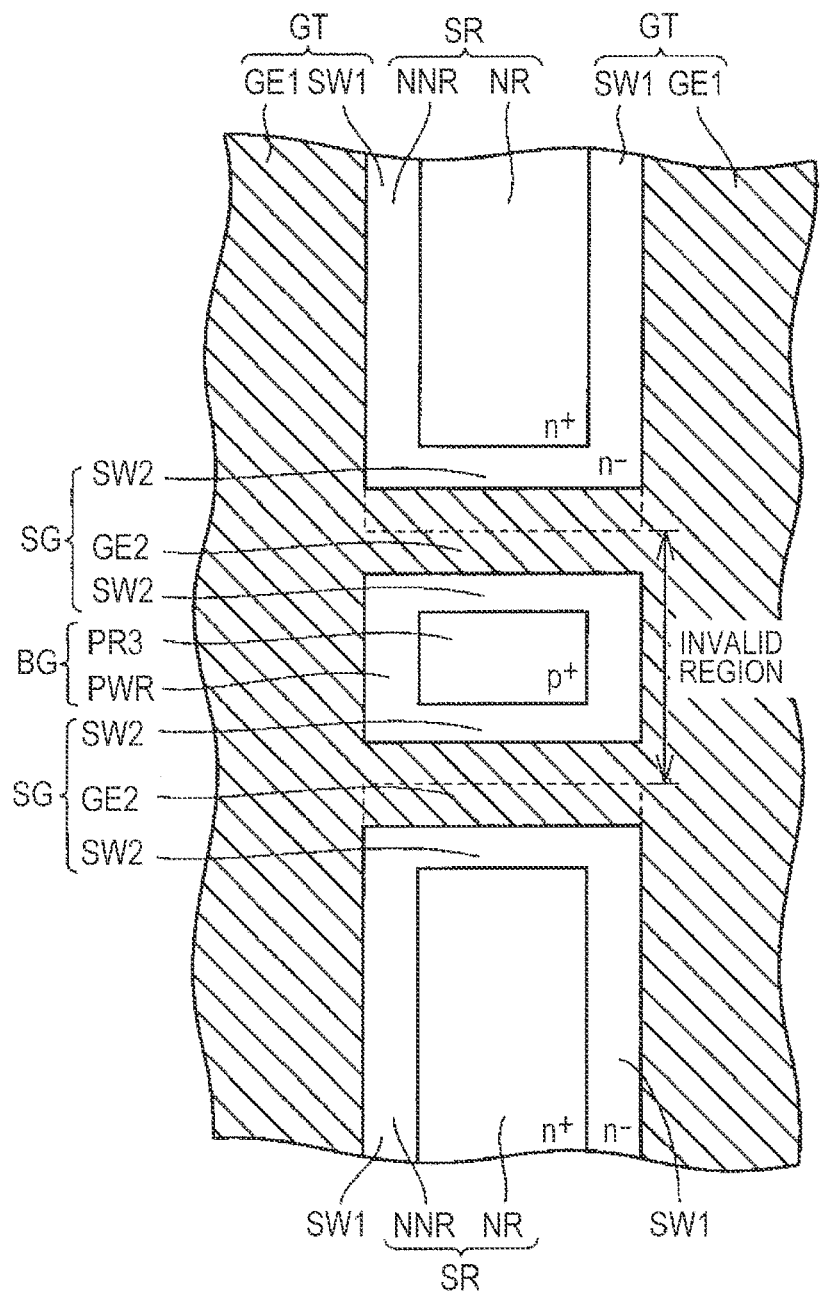
FIG. 5 is a schematic enlarged plan view illustrating a second example of the structure of each of the back gate region and the gate region for isolation according to First Embodiment.

In the structure of FIG. 4, the gate electrode for isolation SG (gate voltage application part GE2) is arranged so as to overlap, when viewed from above, the gate electrode GT (gate voltage application part GE1) at both ends of the gate electrode for isolation SG, the both ends being located in the direction (horizontal direction in FIG. 4) in which the gate electrode for isolation SG extends. With reference to FIG. 5, however, a structure may be provided, in which, for example, the gate electrode for isolation SG (gate voltage application part GE2) and the gate electrode GT (gate voltage application part GE1) are formed so as to be integrated with each other (as the identical layer), instead that the gate electrode for isolation SG (gate voltage application part GE2) does not overlap, when viewed from above, the gate electrode GT (gate voltage application part GE1). In each of the cases of FIGS. 4 and 5, a structure is provided, in which the gate voltage application parts GE2 and GE1 are electrically coupled to each other.

In addition, in each of the cases of FIGS. 4 and 5, the p-type diffused region PR3 is enclosed in planar view by the gate electrode for isolation SG (gate voltage application part GE2) and the gate electrode GT (gate voltage application part GE1).

Herein, the "invalid region" in FIGS. 4 and 5 means a region where an n-type transistor NTR sandwiched, in the direction (vertical direction in each view) in which the source region SR, etc., extends, by the adjacent source regions SR is not to be formed (invalid as the n-type transistor NTR with respect to the vertical direction in each view).

Subsequently, a method of manufacturing the semiconductor device according to the present embodiment will be described with reference to FIG. 6A to 14B. Each of FIGS. 6A to 14A illustrates a method of manufacturing the high voltage tolerant nMOSFET (n-type transistor NTR) illustrated in FIG. 3A, i.e., illustrates a process of manufacturing the region where the high voltage tolerant nMOSFET is to be formed. Each of FIGS. 6B to 14B illustrates a method of manufacturing the region illustrated in FIG. 3B.

Figure 6A:
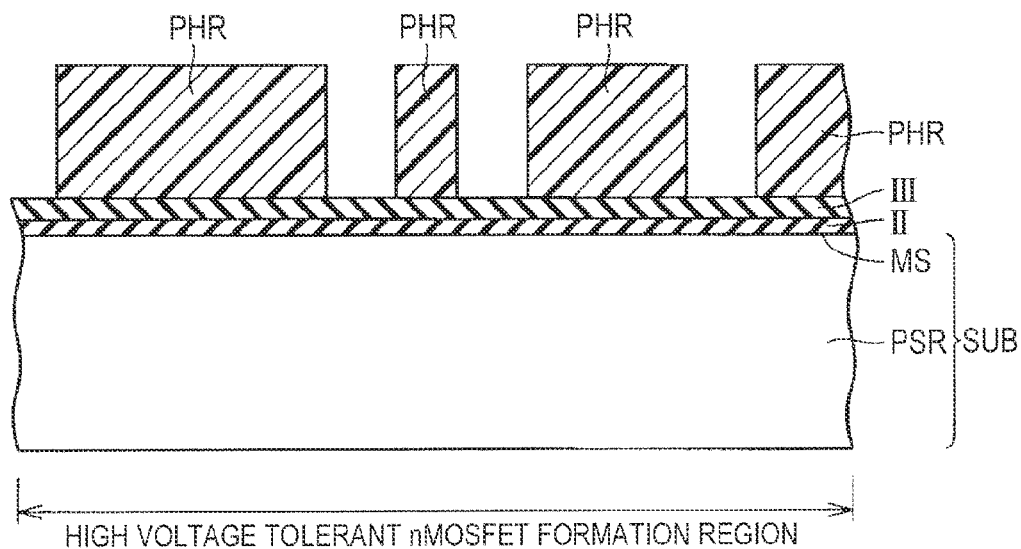
FIGS. 6A and 6B are schematic sectional views illustrating the region illustrated in FIG. 3, in a first step of a manufacturing method according to First Embodiment.
Figure 6B:
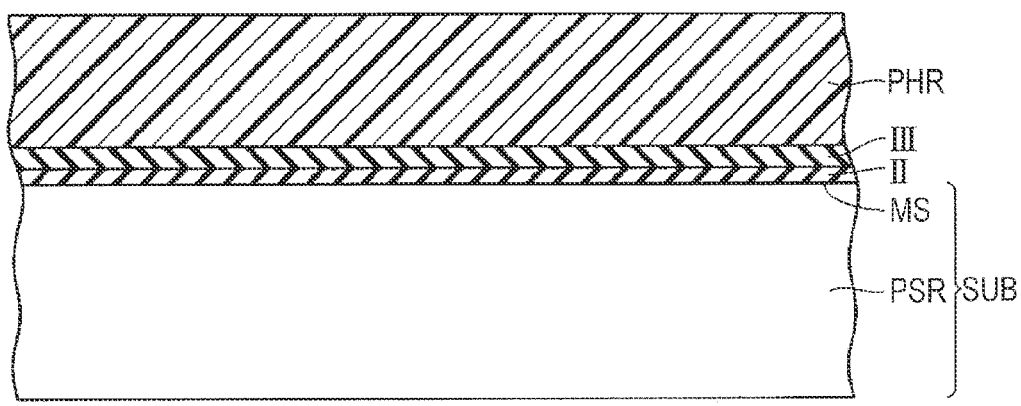

With reference to FIGS. 6A and 6B, a semiconductor substrate SUB that has, inside thereof, a p-type region SR including, for example, p-type impurities, and is comprised of single crystals of silicon is first provided. An insulating film II comprised of a silicon dioxide film and an insulating film III comprised of a silicon nitride film are formed over one main surface MS of the semiconductor substrate SUB in this order by using an ordinary film formation method. Subsequently, a pattern of a photoresist PHR is formed by an ordinary photoengraving technique (exposure technique and development technique), in which a region where an element isolation insulating film LS is to be formed in planar view is opened.

Figure 7A:
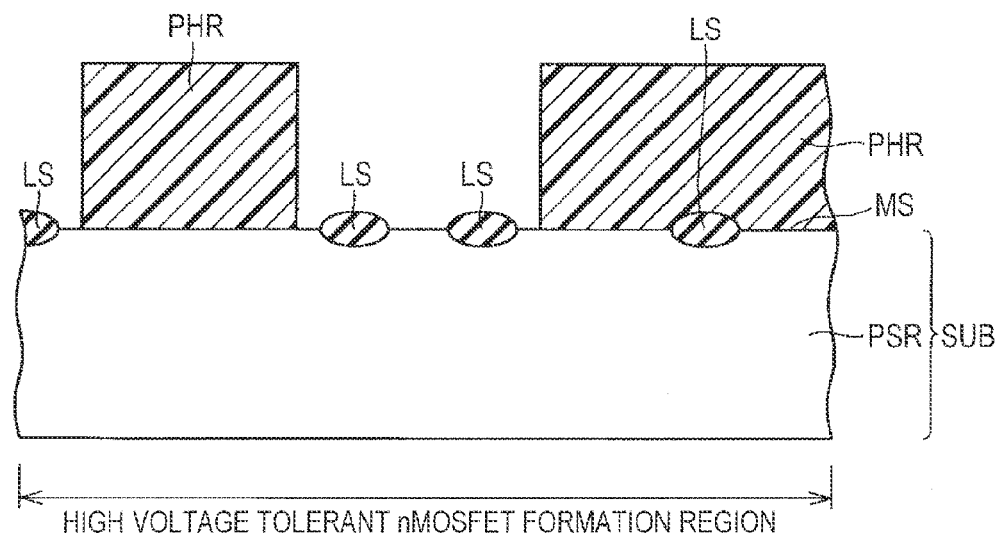
FIGS. 7A and 7B are schematic sectional views illustrating the region illustrated in FIG. 3, in a second step of the manufacturing method according to First Embodiment.
Figure 7B:
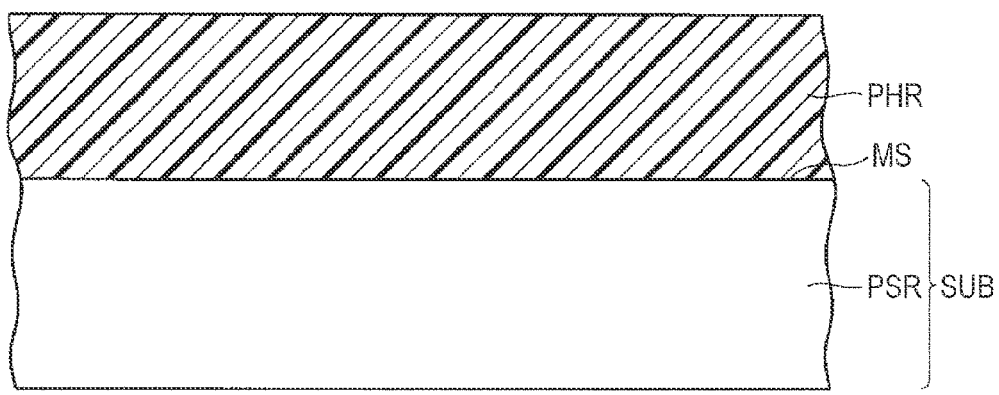

With reference to FIGS. 7A and 7B, an opening of the insulating film III is formed by an ordinary etching technique using the pattern of the photoresist PHR in FIG. 6. After the pattern of the photoresist PHR is removed, the insulating film II located immediately under the opening of the insulating film III is oxidized by an ordinary so-called LOCOS (LOCal Oxidation of Silicon) method with the use of the pattern of the insulating film III as a photomask, thereby allowing the element isolation insulating film LS to be formed.

Although not illustrated, after the aforementioned insulating films II and III and the photoresist PHR are then removed, a silicon dioxide film having a thickness of, for example, 10 nm or more to 50 nm or less is formed over almost the whole main surface MS. Referring again to FIGS. 7A and 7B, a pattern of the photoresist PHR is then formed by an ordinary photoengraving technique, in which a region where the n-type well region LNW is to be formed in planar view is opened.

Figure 8A:
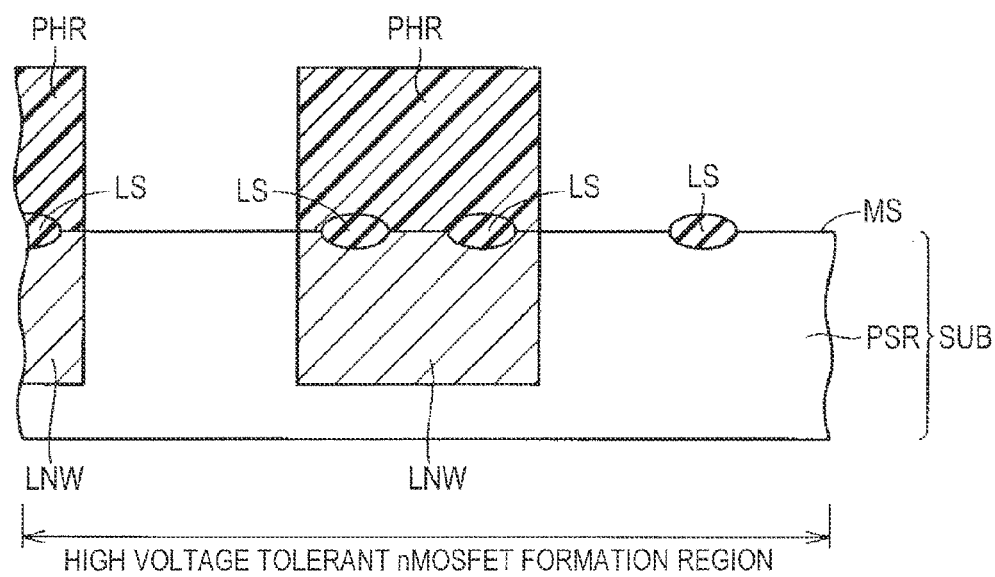
FIGS. 8A and 8B are schematic sectional views illustrating the region illustrated in FIG. 3, in a third step of the manufacturing method according to First Embodiment.
Figure 8B:
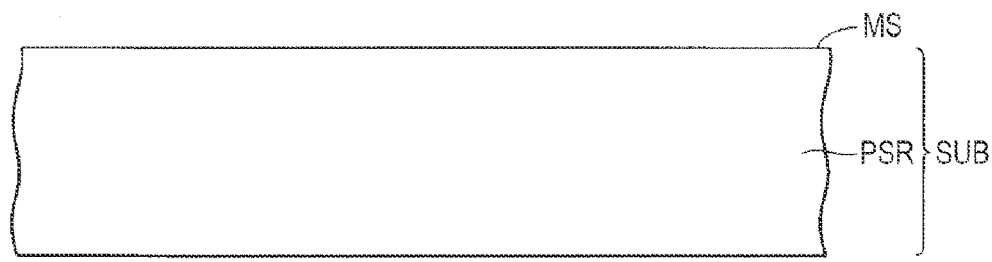

With reference to FIGS. 8A and 8B, for example, impurity ions of phosphorus (P) are implanted, from the upside of the main surface MS and several times, by an ordinary ion implantation method with energy of 50 keV or higher to 300 keV or lower, in a state where the photoresist PHR in FIG. 7 is formed. Thereby, the n-type well region LNW is formed.

Subsequently, after the aforementioned photoresist PHR is removed, a pattern of the photoresist PHR is formed by an ordinary photoengraving technique, in which a region where the p-type well region LPW is to be formed in planar view is opened.

Figure 9A:
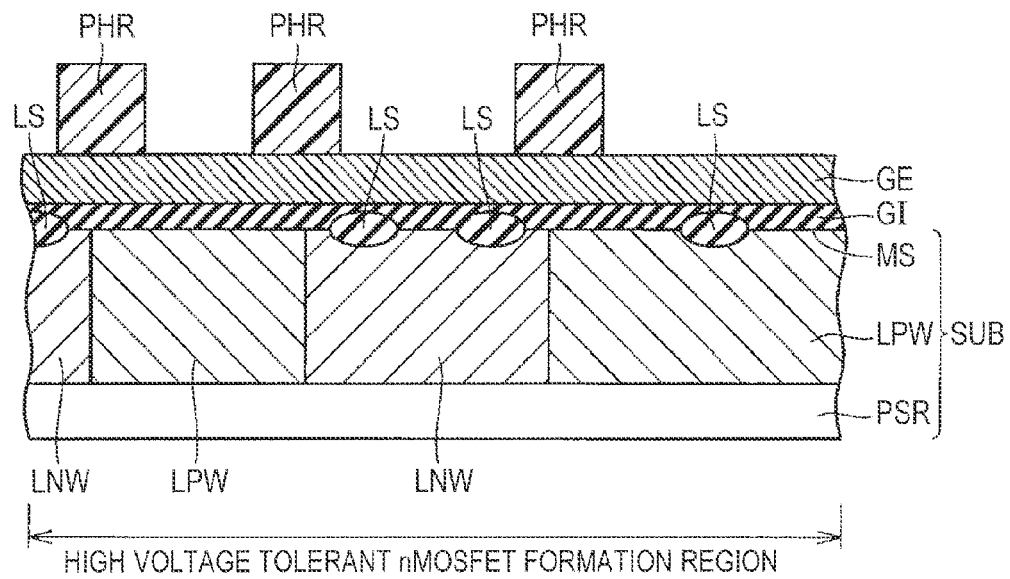
FIGS. 9A and 9B are schematic sectional views illustrating the region illustrated in FIG. 3, in a fourth step of the manufacturing method according to First Embodiment.
Figure 9B:
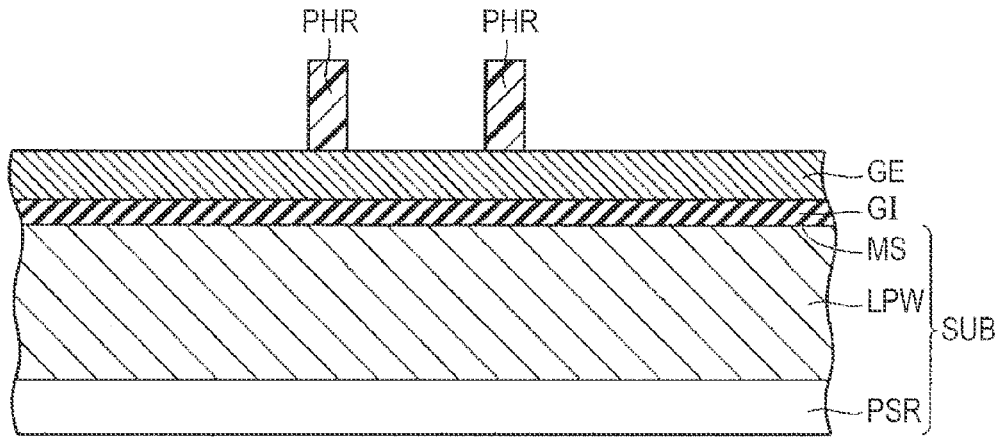

With reference to FIGS. 9A and 9B, for example, impurity ions of boron (B) are implanted, from the upside of the main surface MS and several times, by an ordinary ion implantation method with energy of 20 keV or higher to 1000 keV or lower, in a state where the photoresist PHR in FIG. 8 is formed. Thereby, the p-type well region LPW is formed. In the high voltage tolerant nMOSFET formation region, the p-type well region LPW is formed so as to be adjacent to the n-type well region LNW.

Subsequently, after the aforementioned photoresist PHR is removed, the silicon dioxide film, which has been previously formed over almost the whole main surface MS, is removed. Subsequently, an insulating film GI (silicon dioxide film having a thickness of 10 nm or more to 50 nm or less), which is used for forming the insulating films GI1 and GI2, is formed over almost the whole main surface MS. A polycrystalline silicon film GE for forming the gate voltage application parts GE1 and GE2 is formed so as to cover almost the whole surface of the insulating film GI by using an ordinary CVD (Chemical Vapor Deposition) method.

A pattern of the photoresist PHR is further formed over the polycrystalline silicon film GE by an ordinary photoengraving technique, in which regions where the insulating film. GI and the polycrystalline silicon film GE are removed in planar view are opened.

Figure 10A:
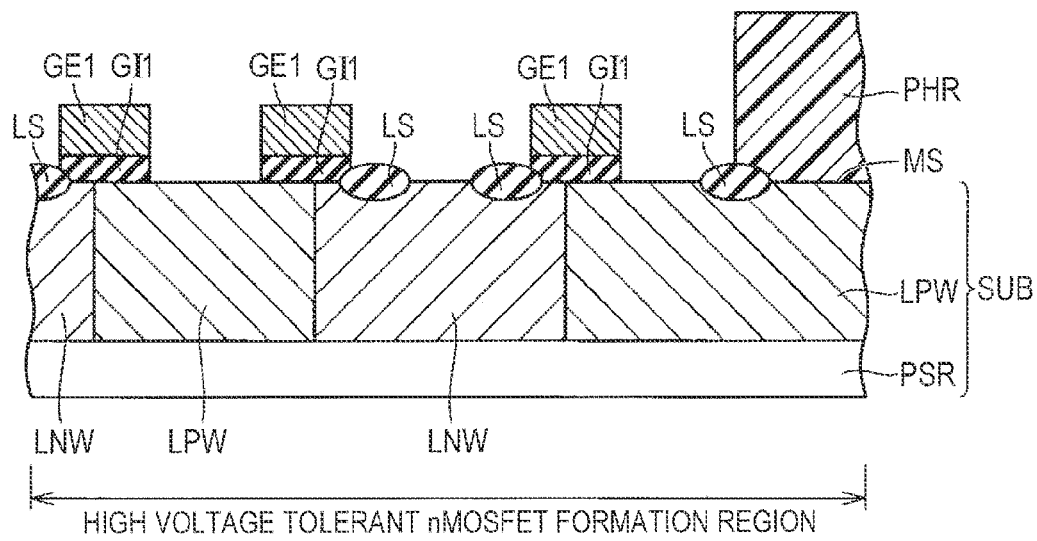
FIGS. 10A and 10B are schematic sectional views illustrating the region illustrated in FIG. 3, in a fifth step of the manufacturing method according to First Embodiment.
Figure 10B:
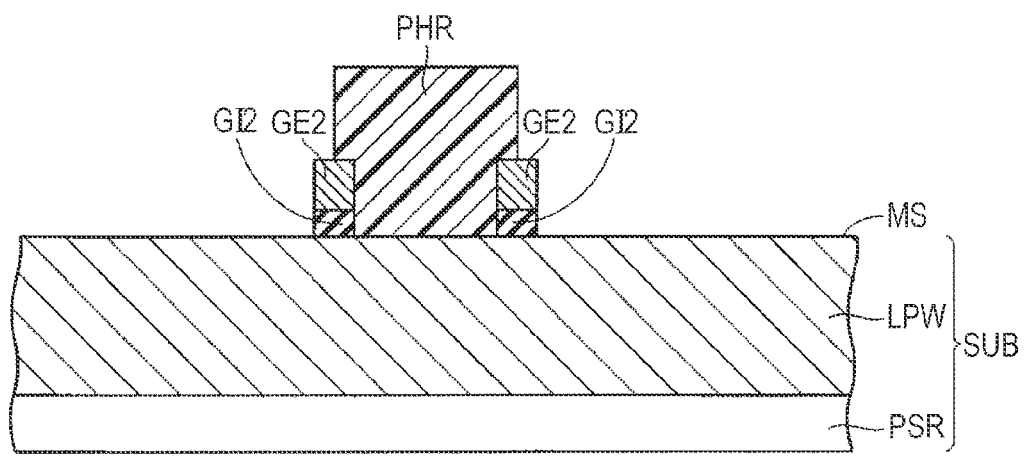

With reference to FIGS. 10A and 10B, ordinary etching is performed on the aforementioned insulating film GI and polycrystalline silicon film GE by using the pattern of the photoresist PHR in FIG. 9 as a photomask, in a state where the pattern thereof is formed, so that the gate insulating films GI1 and GI2 and the gate voltage application parts GE1 and GE2 are formed.

Subsequently, after the aforementioned photoresist PHR (which was used to form the gate insulating films GI1 and GI2, etc.) is removed, a pattern of the photoresist PHR is formed by an ordinary photoengraving technique, in which regions where the low-concentration n-type regions NNR in the source region SR and the drain region DR are to be formed in planar view, and a region that will overlap the gate voltage application part GE in planar view, are opened.

Figure 11A:
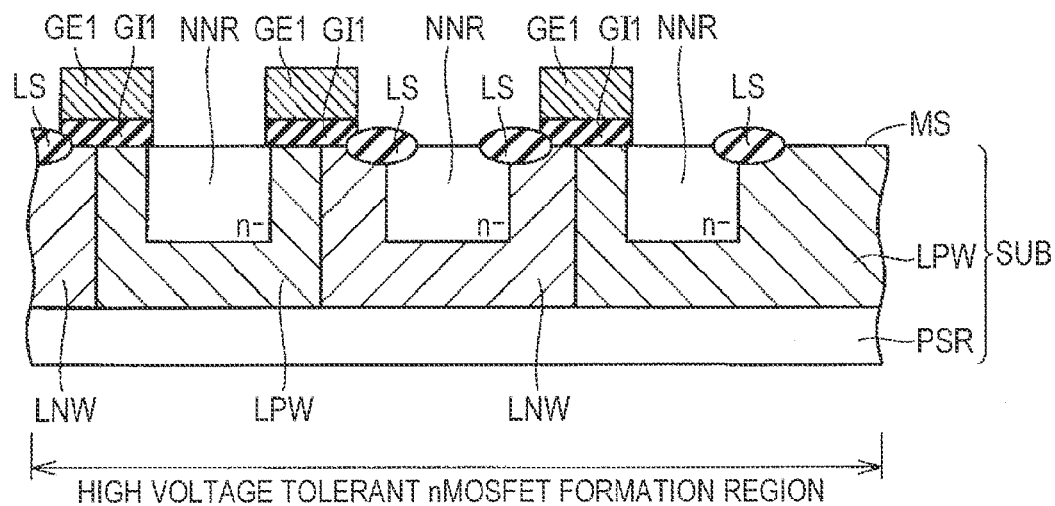
FIGS. 11A and 11B are schematic sectional views illustrating the region illustrated in FIG. 3, in a sixth step of the manufacturing method according to First Embodiment.
Figure 11B:
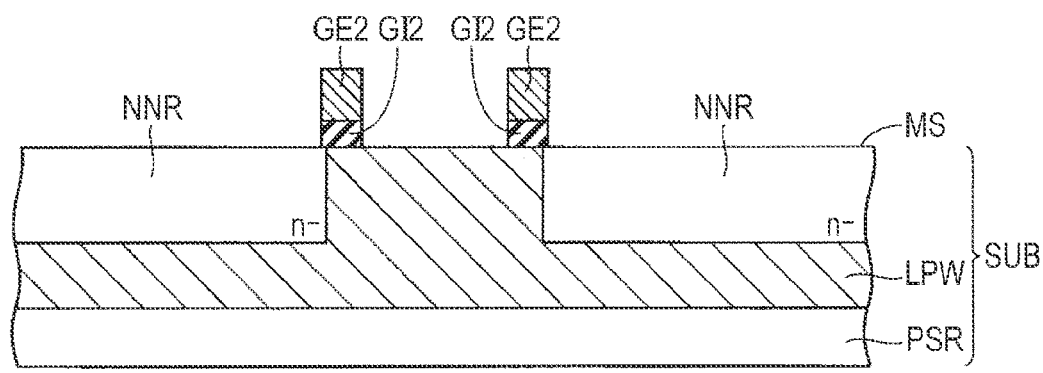

With reference to FIGS. 11A and 11B, for example, impurity ions of phosphorus (P) are implanted, from the upside of the main surface MS, by an ion implantation method with energy of 50 keV or higher to 200 keV or lower, in a state where the photoresist PHR in FIG. 10 is formed. Thereby, the low-concentration n-type region NNR is formed.

Subsequently, after the aforementioned photoresist PHR (which was used to form the low-concentration n-type region NNR) is removed, a silicon dioxide film is deposited, by using, for example a CVD method, over almost the whole main surface MS so as to cover the upper surfaces of the gate voltage application parts GE1 and GE2. It is preferable that the thickness of the silicon dioxide film is 30 nm or more to 300 nm or less.

Figure 12A:
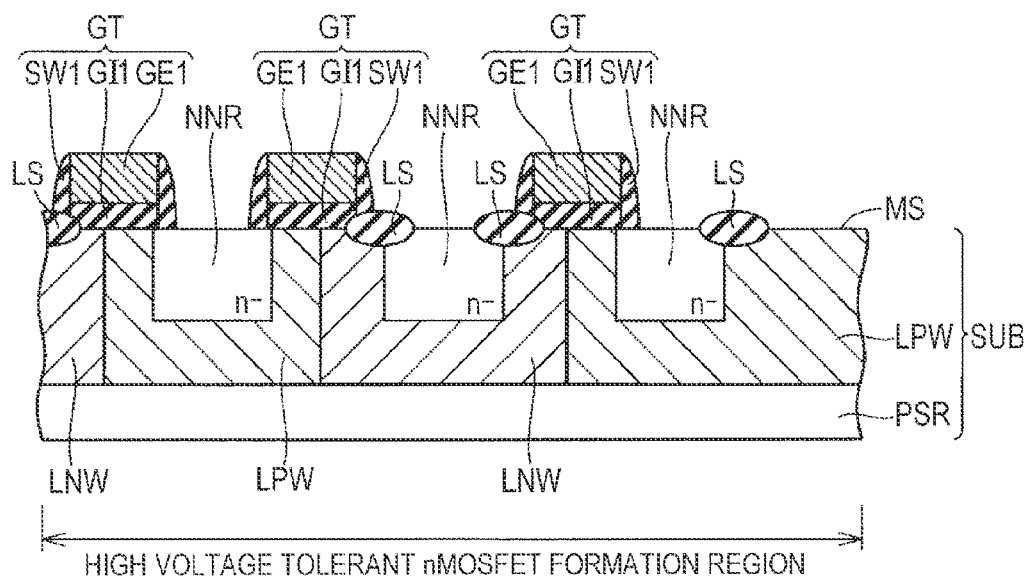
FIGS. 12A and 12B are schematic sectional views illustrating the region illustrated in FIG. 3, in a seventh step of the manufacturing method according to First Embodiment.

With reference to FIGS. 12 A and 12B, the sidewall insulating films SW1 and SW2 are formed so as to cover the side surfaces of the gate voltage application parts GE1 and GE2 and of the gate insulating films GI1 and GI2, with the silicon dioxide film formed in the step in FIG. 11 being etched back. With the aforementioned steps, the gate electrode GT and the gate electrode for isolation SG are formed.

Figure 12B:
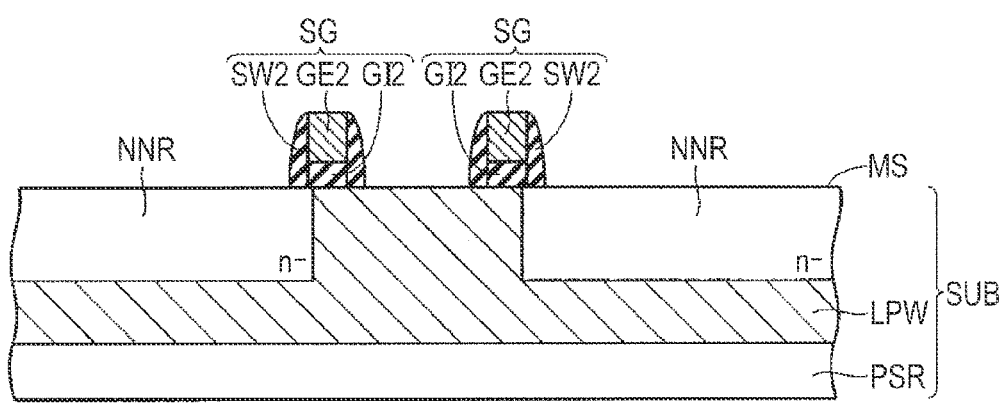

Herein, it is preferable that, as illustrated in FIG. 12B, the gate electrode for isolation SG is formed between the source region SR and a back gate region that contacts the source region SR (region where the p-type well region LPW is exposed) (for example, formed so as to stretch over the source region SR and the p-type well region LPW).

Figure 13A:
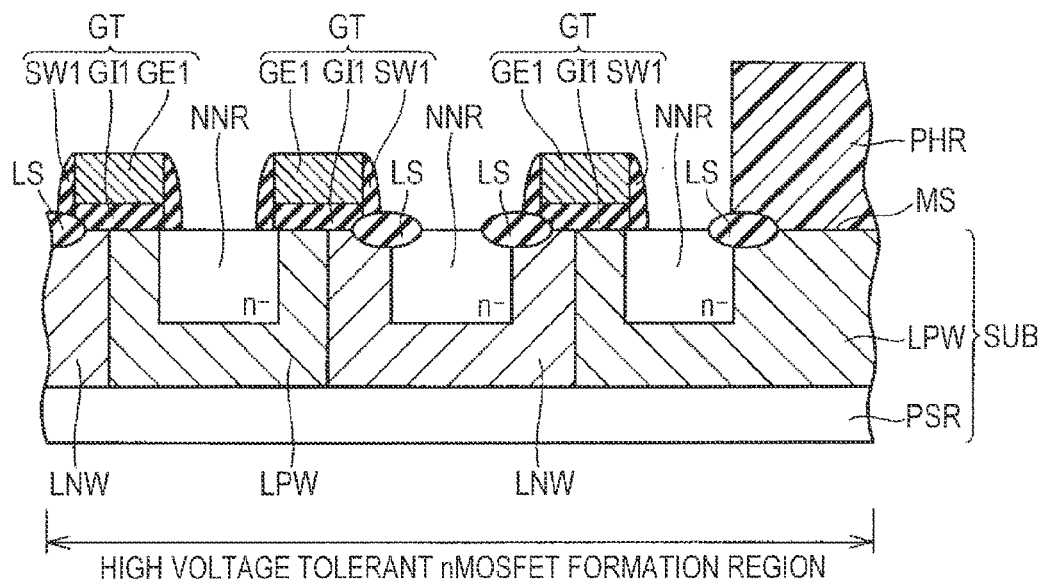
FIGS. 13A and 13B are schematic sectional views illustrating the region illustrated in FIG. 3, in an eighth step of the manufacturing method according to First Embodiment.
Figure 13B:
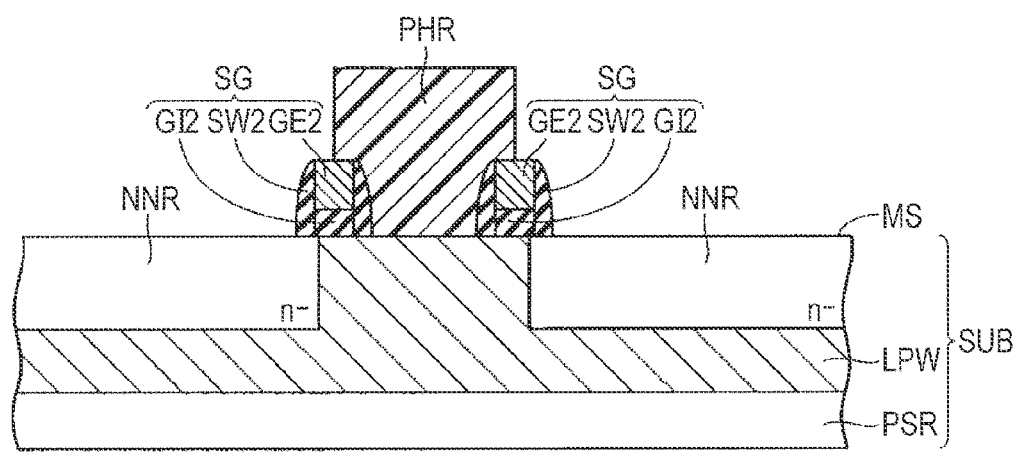

With reference to FIGS. 13A and 13B, a pattern of the photoresist PHR is formed by an ordinary photoengraving technique, in which a region where the n-type impurity region NR is to be formed in planar view and regions that will overlap, in planar view, the gate electrodes GT and SG are opened.

Figure 14A:
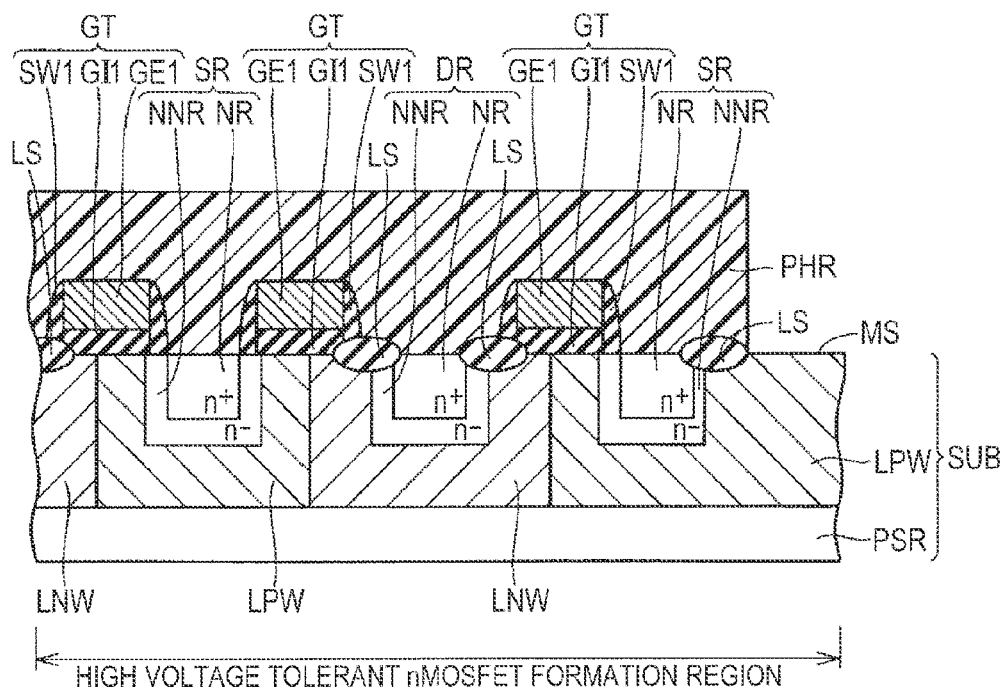
FIGS. 14A and 14B are schematic sectional views illustrating the region illustrated in FIG. 3, in a ninth step of the manufacturing method according to First Embodiment.
Figure 14B:
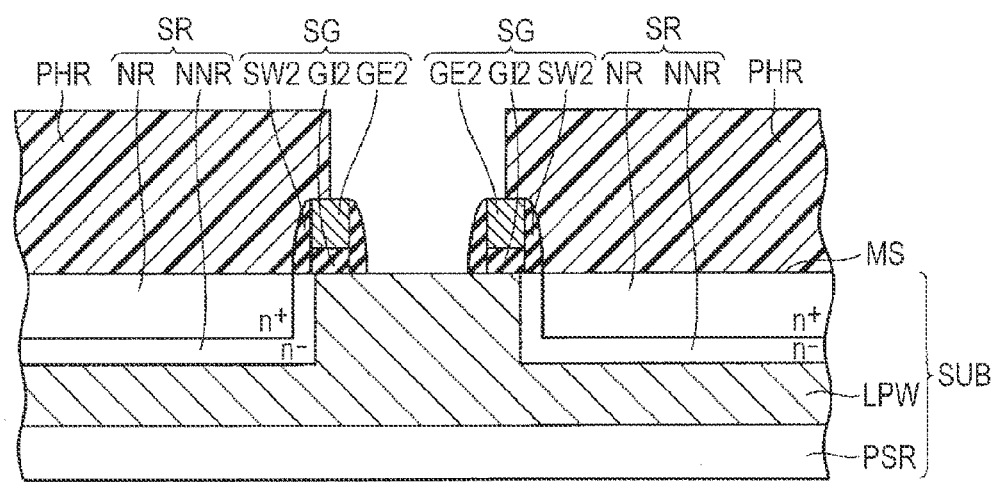

With reference to FIGS. 14A and 14B, for example, impurity ions of arsenic (As) are implanted, from the upside of the main surface MS, by an ion implantation method with energy of 30 keV or higher to 70 keV or lower, in a state where the photoresist PHR in FIG. 13 is formed. Thereby, the n-type impurity region NR is formed. With the aforementioned steps, the drain region DR and the source region SR in the high voltage tolerant nMOSFET are formed.

Subsequently, after the aforementioned photoresist PHR (which was used to form the n-type impurity region NR) is removed, a pattern of the photoresist PHR is formed by an ordinary photoengraving technique, in which a region where the p-type diffused region PR3 is to be formed in planer view is opened.

With reference to FIGS. 3A and 3B, for example, impurity ions of boron fluoride ($BF_2$) are implanted, from the upside of the main surface MS, by an ion implantation method with energy of 20 keV or higher to 60 keV or lower, in a state where the photoresist PHR in FIG. 14 is formed. Thereby, both the p-type diffused region PR3 in the p-type well contact region PWR and the back gate region BG are formed. With the aforementioned steps, the n-type transistor NTR and the p-type transistor PTR are formed.

By performing an ordinary heat treatment immediately after each region is formed by implanting, in each of the aforementioned steps, impurities with an ion implantation method, an impurity distribution in each of the formed regions can be adjusted and a stable state in which the number of crystal faults is small can be made.

Thereafter, by performing a silicide step in which silicide is formed over the surface of each impurity region, such as the n-type impurity region NR, and a step in which an upper surface (such as a conductive contact and upper wiring) is formed, etc., the semiconductor device DEV is formed. In each of the above views, the silicide, contact, and upper wiring, etc., are not illustrated. It is preferable that, for example, a plurality of contacts reaching the upper surfaces of the source region SR and the drain region DR are formed, in planar view, to be spaced apart from each other with respect to the direction in which the source region SR and the drain region DR extend.

In the above description, the region where the high voltage tolerant nMOSFET (pMOSFET) is formed (in particular, the region where the n-type transistor NTR is formed) has been only described; in each step, however, similar processing is performed in the regions other than that, for example, a region where a low voltage nMOSFET (pMOSFET) is formed (see the low voltage logic circuit and low voltage analog circuit in FIG. 1).

Subsequently, operation effects of the present embodiment will be described with reference to FIGS. 15 to 18 according to a technique associated with the embodiment.

Figure 15:
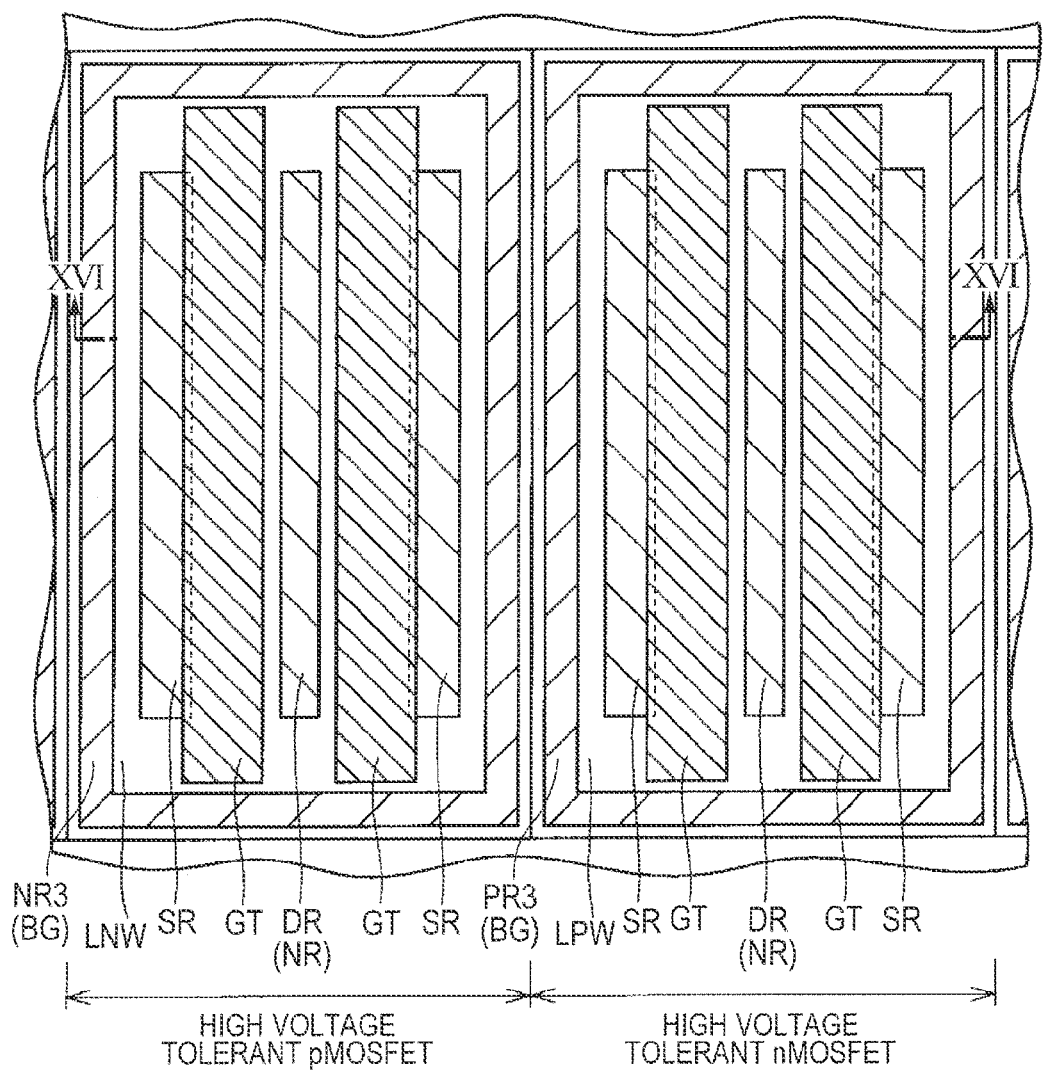
FIG. 15 is a schematic plan view illustrating the structure of each of a high voltage tolerant nMOSFET and a high voltage tolerant pMOSFET according to a technique associated with First Embodiment.
Figure 16:
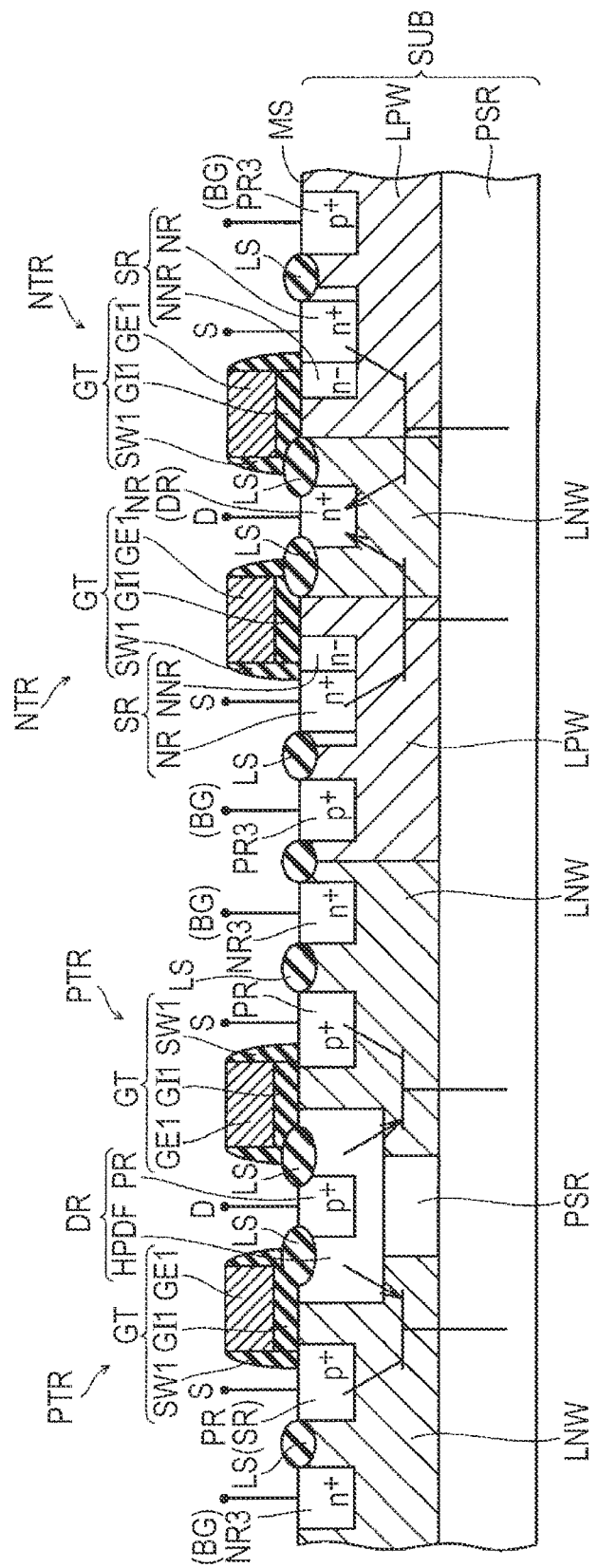
FIG. 16 is a schematic sectional view illustrating the structure of each of the high voltage tolerant nMOSFET and the high voltage tolerant pMOSFET according to the technique associated with First Embodiment.

FIG. 16 is a schematic sectional view, taken along XVI-XVI Line in FIG. 15, and illustrates the structure of a high voltage tolerant pMOSFET region, in addition to the high voltage tolerant nMOSFET region illustrated in FIG. 3A. With reference to FIGS. 15 and 16, a semiconductor device according to a technique associated with the present embodiment basically has a planar structure similar to that of the semiconductor device DEV in FIGS. 2 and 3. In FIGS. 15 and 16, however, a source region SR extending in the vertical direction of FIG. 15 is not divided such that a plurality of the source regions SR may be aligned in the extending direction thereof, but a single source region SR extends in the vertical direction of FIG. 15.

A drain region DR in the high voltage tolerant pMOSFET (p-type transistor PTR) is formed by a p-type impurity region PR and a high voltage p-type drift layer HPDF. Similarly to the n-type well region LNW in the n-type transistor NTR, the p-type drift layer HPDF is formed to suppress occurrence of a failure, occurring due to an abnormal rise in an electric field near to a drain region DR in the high voltage tolerant p-type transistor PTR. It is preferable that the impurity concentration of the p-type impurity region PR is higher than that of the p-type drift layer HPDF. In the aforementioned points, the structure illustrated in FIGS. 15 and 16 is different from that illustrated in FIGS. 2 and 3.

In FIGS. 15 and 16, a back gate region BG (p-type diffused region PR3, n-type diffused region NR3) is formed only in a region at a distance from the transistor NTR or the transistor PTR. In other words, the back gate region BG in FIGS. 15 and 16 is formed only so as to enclose, in a rectangular shape in planar view, a region where a plurality of the transistors NTR or the transistors PTR are formed.

In the region where the high voltage tolerant nMOSFET is formed, if the back gate region BG is formed only in a region at a distance from the n-type transistor NTR, the distance between a source electrode of the n-type transistor NTR and an electrode from which a potential of a p-type well region LPW is extracted becomes large. If the n-type transistor NTR is worked in this state, a current flows between the source electrode of the n-type transistor NTR and the electrode from which a potential of the p-type well region LPW is extracted, thereby causing a potential difference between the two. With this potential difference, the junction between the base and the emitter of the parasitic bipolar transistor illustrated in the circuit view in FIG. 16 becomes forward-bias, and hence the parasitic bipolar transistor begins to work, thereby causing the possibility that the on-state breakdown voltage of the transistor may be decreased.

Such a failure is more likely to occur in the n-type transistor NTR than in the p-type transistor PTR. This is because a decrease in the on-state breakdown voltage, occurring due to impact ionization when a high electric potential acts, is more likely to be caused in an electron that is a carrier by which the n-type transistor NTR works than in a hole that is a carrier by which the p-type transistor PTR works.

In order to reduce the possibility that the aforementioned failure may occur, it is preferable to form the back gate region BG at a region nearer to the n-type transistor NTR. However, if the source region SR and the back gate region BG do not contact each other, there is the possibility that the area of the whole semiconductor device DEV (semiconductor chip) may become large in planar view, due to the back gate region BG formed near to the source region SR.

Accordingly, in order to reduce, in planar view, the area of the whole semiconductor device DEV (semiconductor chip), the aforementioned back contact structure in which the source region SR and the back gate region BG located near to the source region SR contact each other (are adjacent to each other) is provided.

Figure 17:
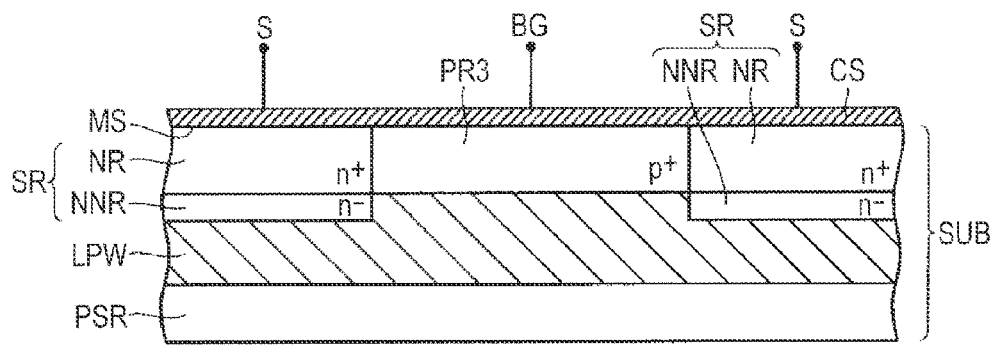
FIG. 17 is a schematic sectional view illustrating a first example of the configuration of a back contact structure according to the technique associated with First Embodiment.
Figure 18:
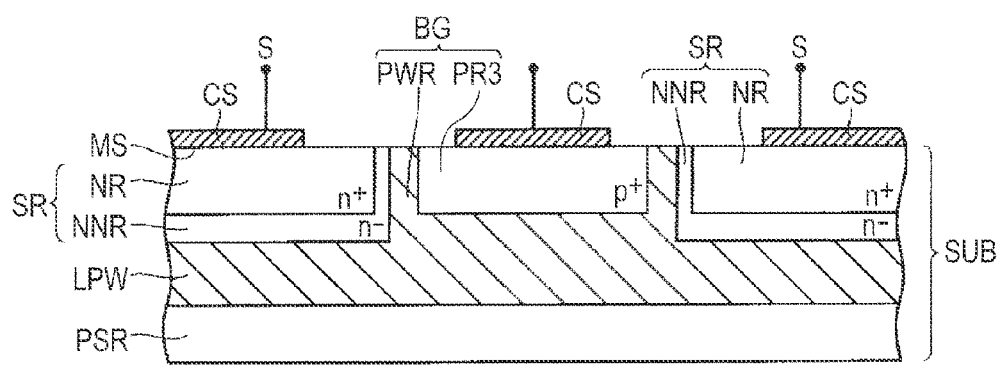
FIG. 18 is a schematic sectional view illustrating a second example of the configuration of the back contact structure according to the technique associated with First Embodiment.

With reference to FIGS. 17 and 18, a back contact structure is illustrated in these views, the back contact structure being formed by, similarly to that in FIG. 3B: a plurality of (e.g., a pair of) source regions SR that are formed to be spaced apart from each other in the direction in which a drain region (not illustrated) extends; and a back gate region BG formed so as to contact these source regions SR. With such a back contact structure, the distance between the source region SR and the back gate region BG is made small, and hence the aforementioned work (in FIGS. 15 and 16) of a parasitic bipolar transistor can be suppressed. Further, the back gate region BG is formed so as to be sandwiched by the pair of the source regions SR (so as to interpose, in planar view, between part of the pair of the source regions SR), and hence the area of the whole semiconductor device DEV can be reduced in planar view.

With reference to FIG. 17, however, a p-type diffused region PR3 as the back gate region BG is directly in contact with the source region SR, and when a silicide layer CS comprised of, for example, cobalt-silicon is formed so as to cover both the p-type diffused region PR3 and the source region SR, the potentials of the source region SR and the back gate region BG (p-type diffused region PR3) becomes equal to each other, because the two regions are short-circuited each other. If this occurs, it becomes impossible to independently control the source region SR and the back gate region BG, thereby causing the possibility that normal work of the semiconductor device DEV may be hampered.

With reference to FIG. 18, in order to suppress a short circuit between the source region SR and the back gate region BG (p-type diffused region PR3) in FIG. 17, the p-type diffused region PR3 is formed so as not to contact the source region SR by being reduced in size, and a silicide layer CS contacting the upper surface of the source region SR and a silicide layer CS contacting the upper surface of the back gate region BG (p-type diffused region PR3) are divided from each other. With such a structure, a short circuit between the source region SR and the back gate region BG (p-type diffused region PR3) can be suppressed. In the structure in FIG. 18, however, it is preferable that the space between the n-type diffused region NR in the source region SR and the p-type diffused region PR in the back gate region BG is made to be at least 0.5 μm (preferably 1 μm), in order to stabilize the on-state breakdown voltage. Accordingly, if the structure in FIG. 18 is adopted, there is the possibility that the area of the whole semiconductor device DEV (semiconductor chip) may be expanded in planar view with the layout being expanded.

In the present embodiment, the p-type diffused region PR3 is arranged between a pair of the source regions SR in the high voltage tolerant nMOSFET (pMOSFET). As a result, the distance between a channel of the n-type transistor NTR having the source region SR as a component and the p-type diffused region PR3 becomes small. With such a structure, the area of the whole semiconductor device DEV can be made small and work of a parasitic bipolar transistor can be suppressed. Accordingly, malfunction of the high voltage tolerant nMOSFET (pMOSFET) can be suppressed and a decrease in the on-state breakdown voltage thereof can be suppressed.

The gate electrode for isolation SG formed between the pair of the source regions SR and the p-type diffused region PR3 suppresses a short circuit between the source region SR and the p-type diffused region PR3, makes it possible to independently control the source region SR and the p-type diffused region PR3. This is because, the gate electrode for isolation SG basically has the same structure as that of the gate electrode GT of the n-type transistor NTR and has a switching function similarly to the gate electrode GT, it becomes possible to control the gate electrode for isolation SG so as to suppress conduction between the source region SR and the p-type diffused region PR3.

Further, by providing aback contact structure in which the p-type well contact region PWR contacts the source region SR, the distance between each of the source regions SR and the back gate region BG (p-type diffused region PR3) sandwiched by them is made small, and the distance between the channel of the n-type transistor NTR having the source region SR as a component and the back gate region BG (p-type diffused region PR3) is further made small. With such a structure, the area of the whole semiconductor device DEV can be made small and work of a parasitic bipolar transistor can be suppressed, and the area of the whole semiconductor device DEV can be reduced in planar view.

In the present embodiment, by forming the gate electrode for isolation SG so as to be integral with the gate electrode GT, for example, as illustrated in FIG. 5, both of the two can also be simultaneously formed (see the steps in FIGS. 10A to 12B), and hence a simpler structure can be provided in which both of the two are integrated with each other as an integrated gate electrode.

Also, in the present embodiment, the area of the whole semiconductor device DEV can be reduced with the p-type diffused region PR3 located between the pair of the source regions S being enclosed, in planar view, by the gate electrode for isolation SG and the gate electrode, as illustrated in FIGS. 4 and 5.

As stated above, a decrease in the on-state breakdown voltage of a channel region, occurring while a transistor is working due to impact ionization, is more likely to be caused in the n-type transistor NTR than in the p-type transistor PTR. Accordingly, the aforementioned operation effects can be further enhanced by forming the gate electrode for isolation SG in the high voltage tolerant nMOSFET formation region. Alternatively, the gate electrode for isolation SG may be formed in the high voltage tolerant pMOSFET formation area, also in this case, the same effects can be obtained as in the former case.

Further, the width of the invalid region (see FIGS. 4 and 5) can be made smaller by using the gate electrode for isolation SG, as in the present embodiment, in comparison with the case where the later-described insulating film for isolation SLS is used; and hence the area of the main surface of the semiconductor substrate SUB can be used more effectively as a region where a transistor is arranged.

Furthermore, when the gate electrode for isolation SG is used, as in the present embodiment, the accuracy in positioning the source electrode SR (n-type impurity region NR) and the p-type diffused region PR3 can be improved. That is, by forming the gate electrode for isolation SG between the source region SR (n-type impurity region NR) and the p-type diffused region PR3, a failure, in which the position where the source region SR (n-type impurity region NR) is to be formed and a position where the p-type diffused region PR3 is to be formed are overlapped each other, can be suppressed.

Second Embodiment

Figure 19:
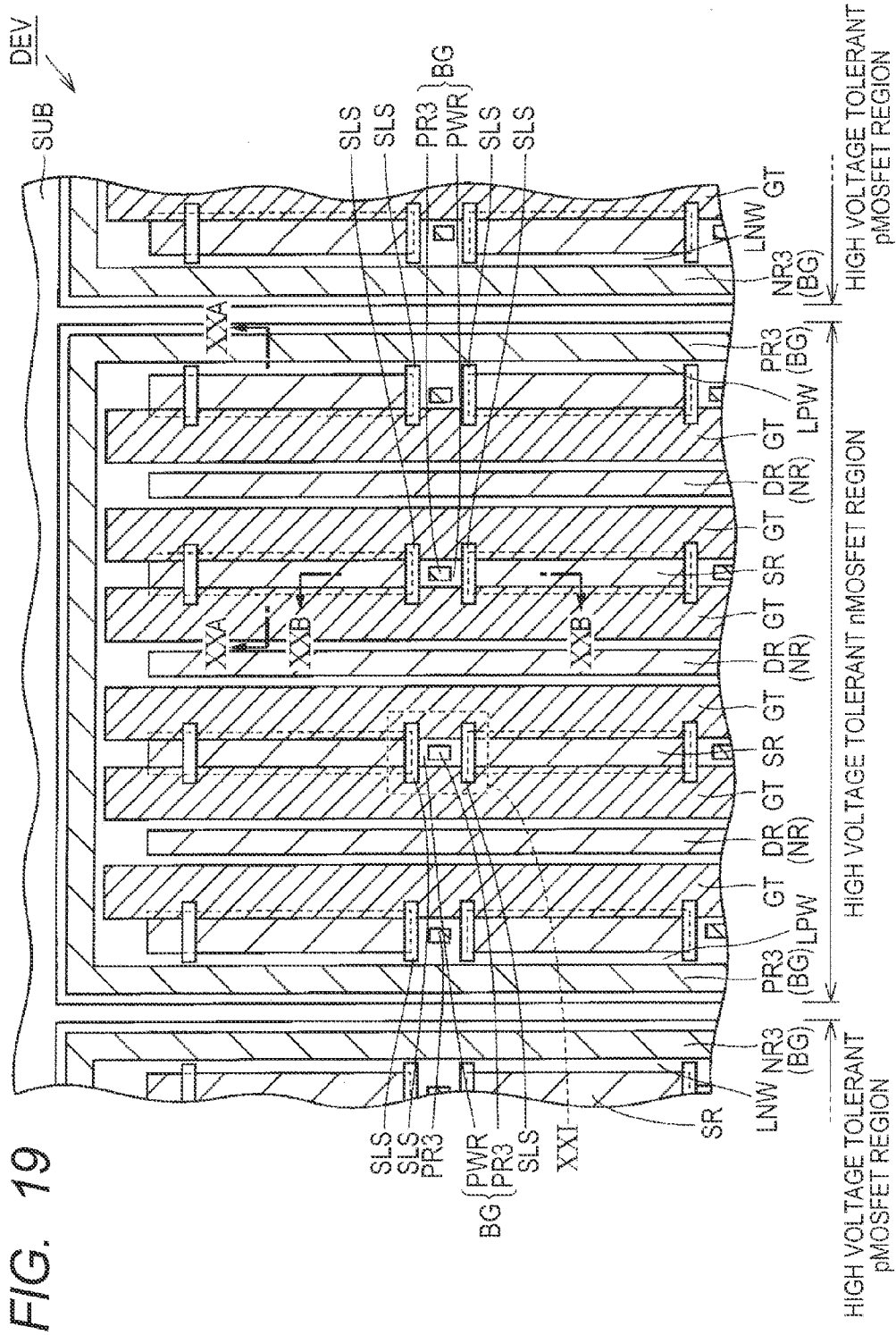
FIG. 19 is a schematic plan view illustrating the structure of each of a high voltage tolerant nMOSFET and a high voltage tolerant pMOSFET formed in a semiconductor device according to Second Embodiment.
Figure 20A:
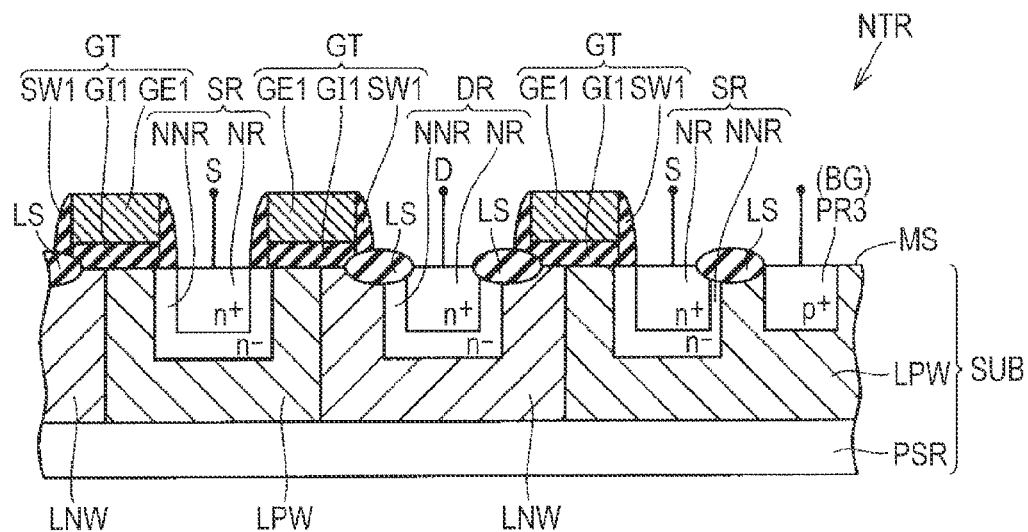
FIGS. 20A and 20B are schematic sectional views illustrating the structures of the high voltage tolerant nMOSFET and the high voltage tolerant pMOSFET formed in the semiconductor device according to Second Embodiment.
Figure 20B:
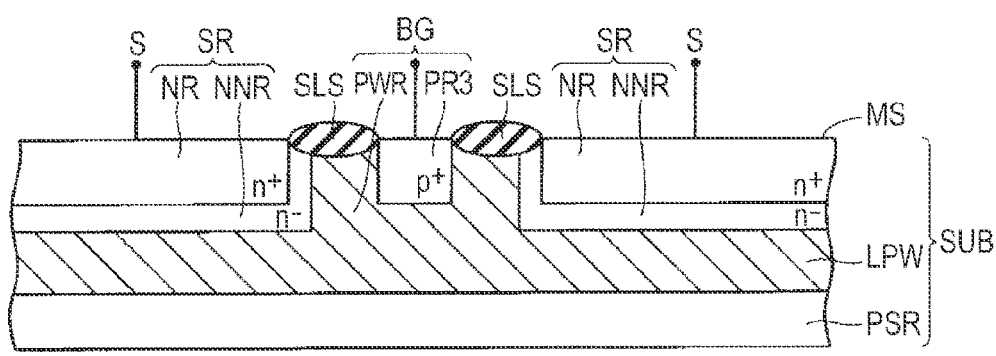
Figure 21:
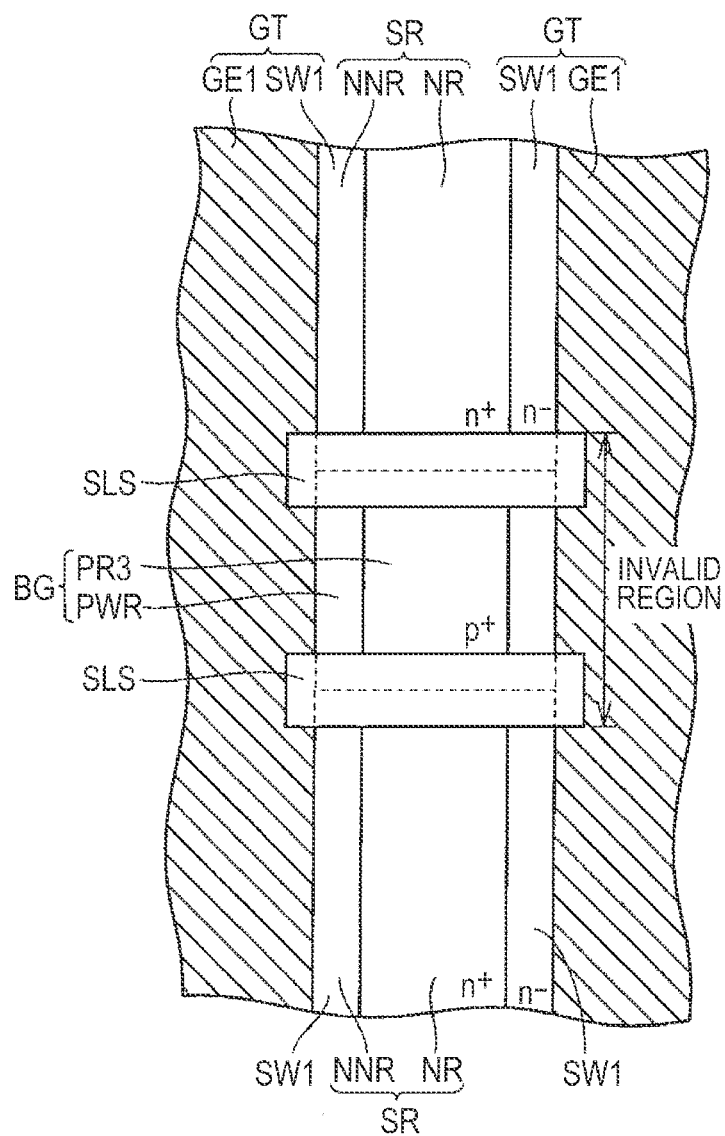
FIG. 21 is a schematic enlarged plan view illustrating a first example of the structure of each of a back gate region and a gate region for isolation according to Second Embodiment.

FIG. 19, FIG. 20, and FIG. 21 correspond to FIG. 2 in First Embodiment, FIG. 3 therein, and FIG. 4 therein, respectively. With reference to FIG. 19, FIGS. 20A and 20B, and FIG. 21, the present embodiment is different from First Embodiment in that an insulating film for isolation SLS is formed instead of the gate electrode for isolation SG according to First Embodiment 1. Specifically, the insulating film for isolation SLS is formed, similarly to the gate electrode for isolation SG according to First Embodiment, over the main surface of the semiconductor substrate SUB in a region between the source region SR and the p-type diffused region PR3, in the region the gate electrode for isolation SG being formed.

The insulating film for isolation SLS is formed of, for example, a silicon dioxide film that is the same as that of the element isolation insulating film LS. It is preferable that the insulating film for isolation SLS is formed in the same way as in the element isolation insulating film LS, for example, formed simultaneously in the steps in FIGS. 6A and 7B.

This insulating film for isolation SLS is arranged between the two source regions SR, a plurality of (two or more of) the source regions SR being aligned in the direction in which the drain region extends. That is, a plurality of the insulating films for isolation SLS are arranged to be spaced apart from each other in the direction in which the drain region DR extends (i.e., the vertical direction in FIG. 2 that intersects with a direction along which the source region SR and the drain region DR are brought together).

As illustrated particularly in FIG. 21, the p-type diffused region PR3 is enclosed, in planar view, by the insulating film for isolation SLS and the gate electrode GT. This is because the insulating film for isolation SLS is arranged instead of the gate electrode for isolation SG according to First Embodiment.

An "invalid region" in the present embodiment also includes a region covered with the insulating film for isolation SLS, in addition to a region sandwiched by a pair of the source regions SR that are adjacent to each other in the direction (vertical direction in each view) in which the source region SR, etc., extends, in the region the n-type transistor NTR not being formed (invalid for the n-type transistor NTR with respect to the vertical direction in the view).

The structure according to the present embodiment is different from that of First Embodiment only in these points, and is the same as that in other points; accordingly, like components will be denoted with like reference numerals and description thereof will not be repeated.

Also, in the present embodiment, the insulating film for isolation SLS suppresses a short circuit between the source region SR and the p-type diffused region PR3, thereby allowing the two regions to be independently controlled, similarly to the gate electrode for isolation SG according to First Embodiment. Accordingly, the insulating film for isolation SLS provides the same effects as in First Embodiment.

In addition, the p-type diffused region PR3 is enclosed by the insulating film for isolation SLS and the gate electrode GT, and hence the area of the whole semiconductor device DEV can be reduced.

The present embodiment is different from First Embodiment only in the aforementioned points. That is, The structures, conditions, procedures, and effects according to the present embodiment, which have not been described above, all comply with First Embodiment.

Third Embodiment

Figure 22:
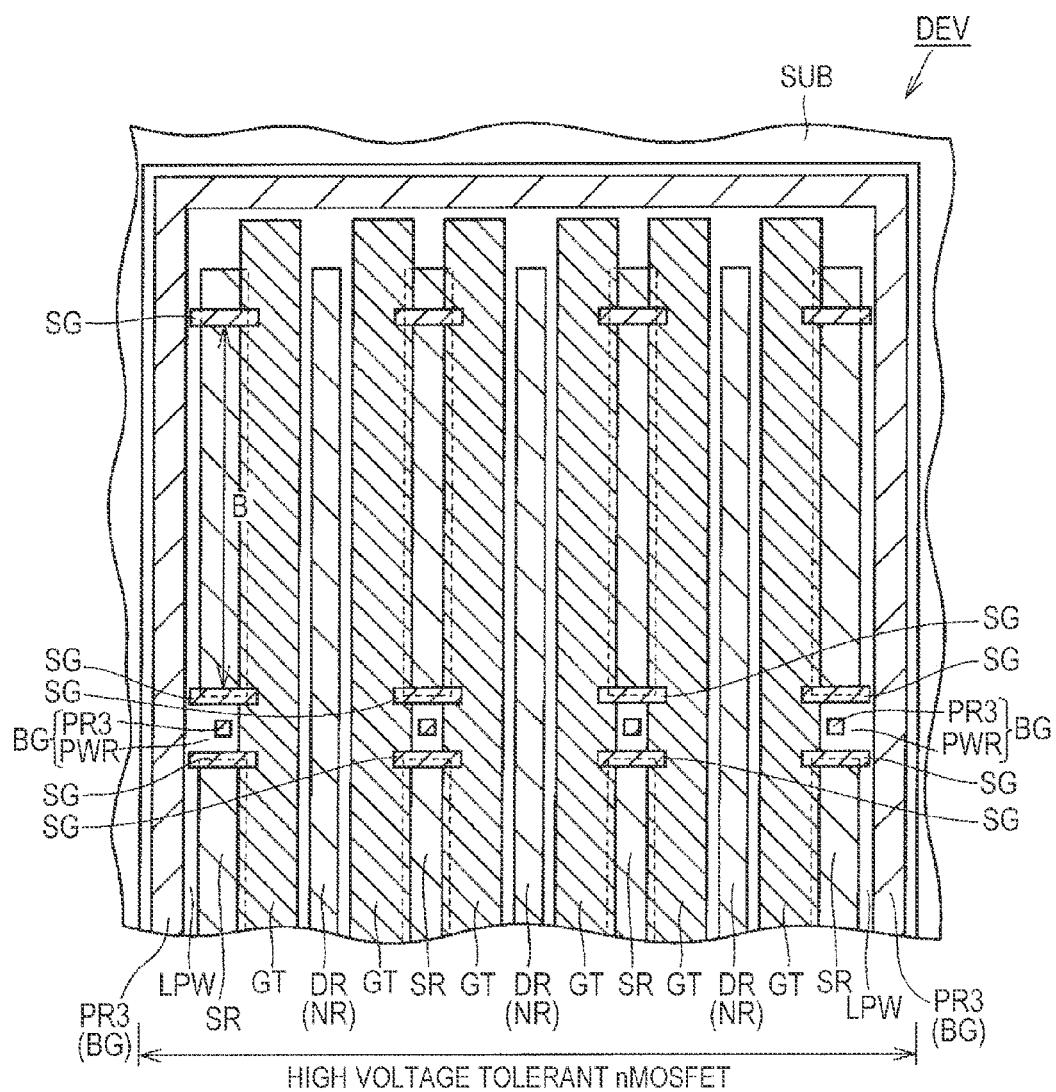
FIG. 22 is a schematic plan view illustrating the structure of a high voltage tolerant nMOSFET formed in a semiconductor device according to Third Embodiment.

FIG. 22 illustrates a region corresponding to the high voltage tolerant nMOSFET formation region according to First Embodiment in FIG. 2. With reference to FIG. 22, although the region in FIG. 22 has basically the same structure as that in FIG. 2, the width B of a source region SR, in the vertical direction in which the source region SR extends, is made larger than the width A of the source region SR in FIG. 2. That is, in FIG. 22, the space of a back gate region BG between a pair of the source regions SR, which are adjacent to each other, is made larger than that in FIG. 2.

The structure according to the present embodiment is different from that of First Embodiment only in this point, and is the same as that in other points; accordingly, like components will be denoted with like reference numerals and description thereof will not be repeated.

Because the width of the source region SR according to the present embodiment becomes larger than that in First Embodiment, the area of the source region SR becomes larger than that in First Embodiment, thereby allowing both a region that functions as the n-type transistor NTR and a region through which a current can be sent to be large. As a result, an effect of decreasing the on-state breakdown voltage can be enhanced.

Fourth Embodiment

Figure 23:
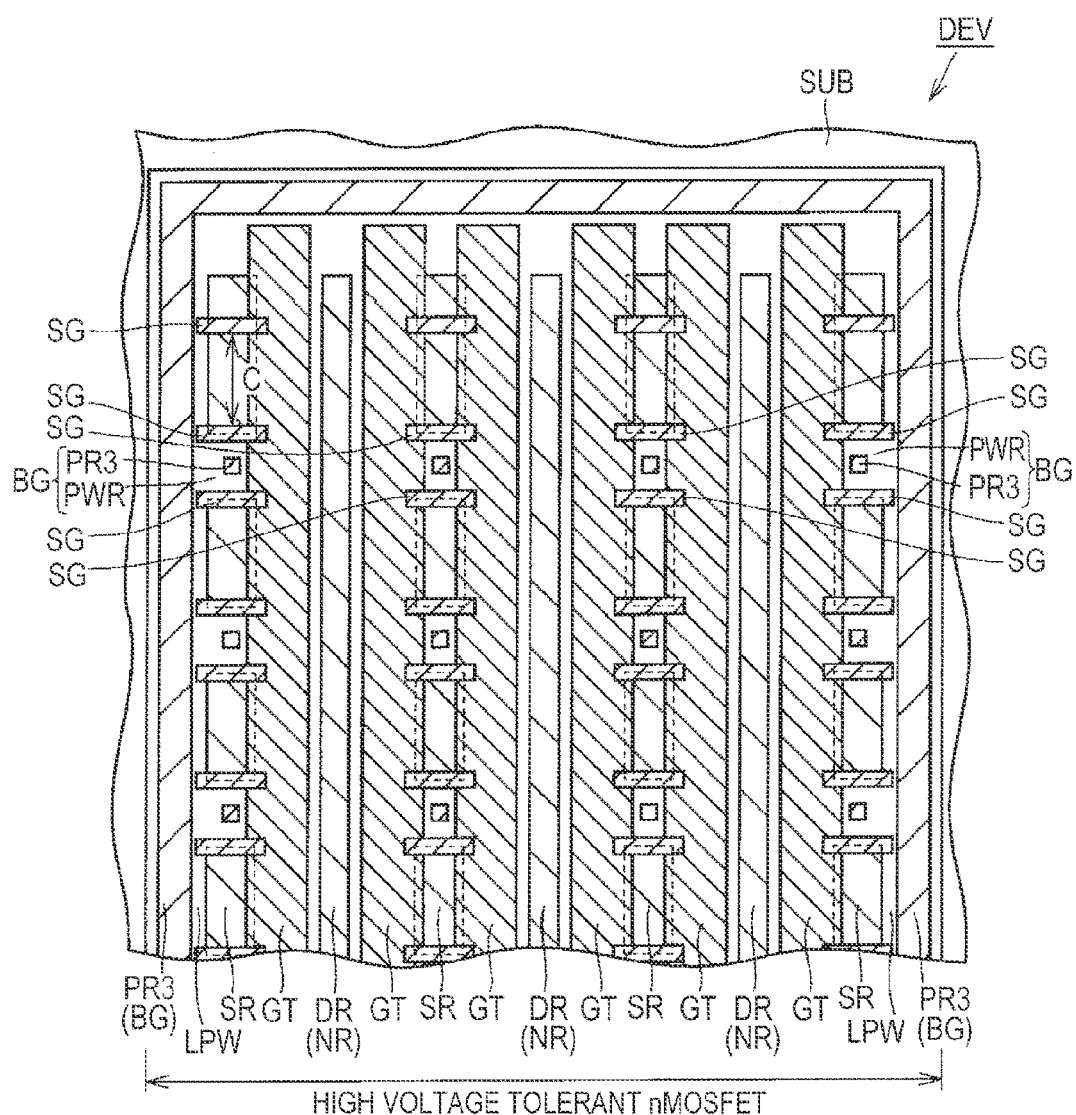
FIG. 23 is a schematic plan view illustrating the structure of a high voltage tolerant nMOSFET formed in a semiconductor device according to Fourth Embodiment.

FIG. 23 illustrates a region corresponding to the high voltage tolerant nMOSFET formation region according to First Embodiment in FIG. 2. With reference to FIG. 23, although the region in FIG. 23 has basically the same structure as that in FIG. 2, the width C of a source region SR, in the vertical direction in which the source region SR extends, is made smaller than the width A of the source region SR in FIG. 2. That is, in FIG. 23, the space between back gate regions BG each being located between a pair of the source regions SR that are adjacent to each other, is made smaller than that in FIG. 2.

The structure according to the present embodiment is different from that of First Embodiment only in this point, and is the same as that in other points; accordingly, like components will be denoted with like reference numerals and description thereof will not be repeated.

In the present embodiment, the width of the source region SR becomes smaller than that in First Embodiment and the distance between the back gate regions BG becomes small. Accordingly, the distance between the back gate region BG (p-type diffused region PR3) and the source region SR (n-type impurity region NR) becomes smaller than that in First Embodiment. Accordingly, the possibility that a parasitic bipolar transistor may work can be further reduced.

In the present embodiment, the possibility that a parasitic bipolar transistor may work can be further reduced from the viewpoint that the number of the back gate regions BG, which are formed near to the source region SR, can be more increased than in First Embodiment.

Although the gate electrode for isolation SG is formed in FIGS. 22 and 23, the case where the insulating film for isolation SLS is formed instead of the gate electrode for isolation SG can be considered in the same way as in the case where the gate electrode for isolation SG is formed.

Figure 24:
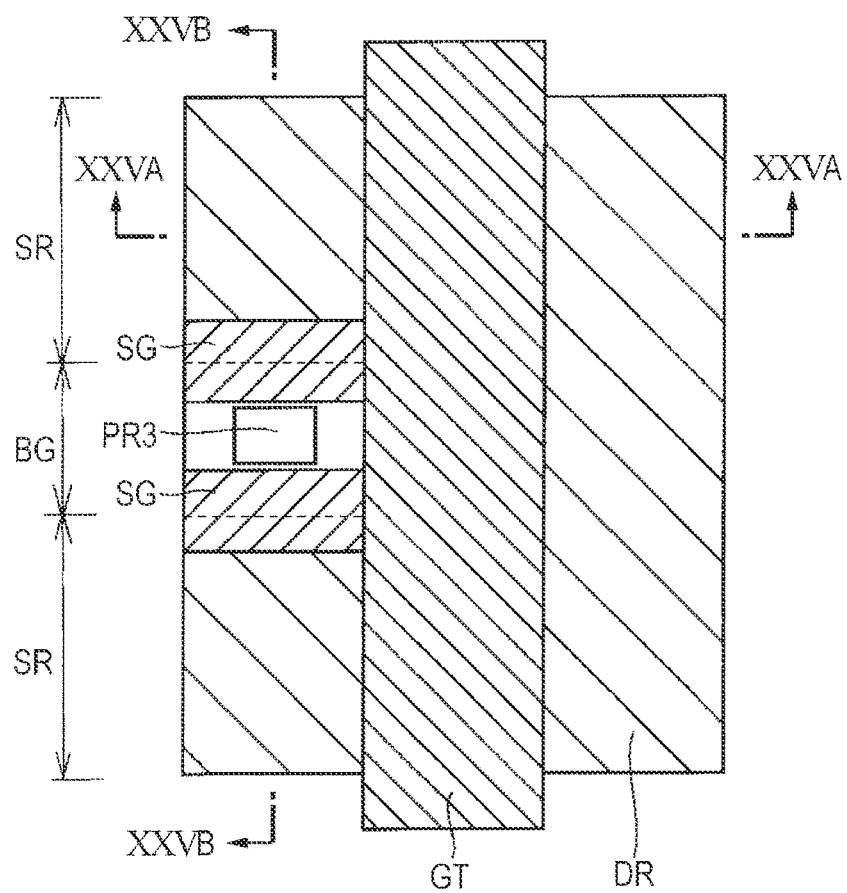
FIG. 24 is a schematic plan view extracting an essential point of a semiconductor device according to one embodiment.

Each of the structural features described in First Embodiment through Fourth Embodiment can be appropriately combined with each other. Finally, essential points in the preferred embodiments will be described with reference to FIGS. 24 and 25. Each component illustrated in FIGS. 24 and 25 is the same as that denoted with the already-described identical numeral reference. Herein, FIG. 25A is a schematic sectional view, taken along XXVA-XXVA Line in FIG. 24, and FIG. 25B is a schematic sectional view, taken along XXVB-XXVB Line in FIG. 24.

Figure 25A:
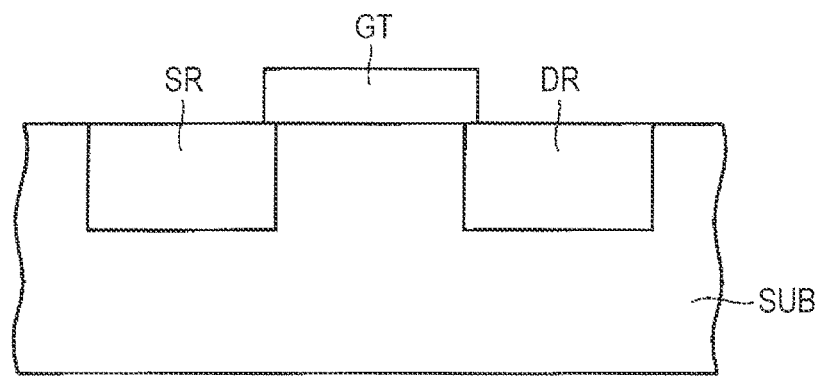
FIGS. 25A and 25B are schematic sectional views extracting the essential point of the semiconductor device according to the one embodiment.
Figure 25B:
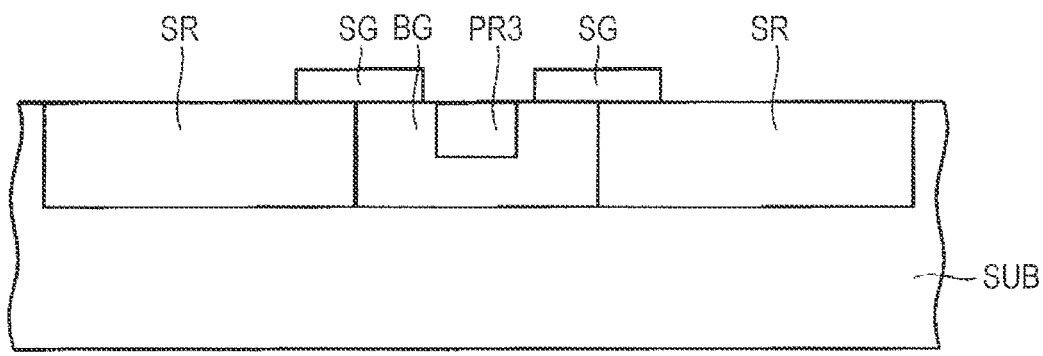

With reference to FIGS. 24, 25A, and 25B, a transistor according to an embodiment has a source region SR from which a source electrode is extracted, a drain region DR from which a drain electrode is extracted, and a gate electrode GT. A plurality of the source regions SR are arranged to be spaced apart from each other so as to face a region where the gate electrode GT extends. A back gate region BG, from which a potential of a well region where the source region SR is formed is extracted, is formed between the source regions SR arranged to be spaced apart from each other. A gate electrode for isolation SG is formed between the source region SG and a p-type diffused region PR3 in the back gate region BG.

The invention made by the present inventors has been specifically described above based on preferred embodiments; however, it is needless to say that the invention should not be limited to the preferred embodiments and various modifications may be made to the invention within a range not departing from the gist of the invention.

What is claimed is:

1. A semiconductor device comprising a high voltage tolerant transistor,
    wherein the high voltage tolerant transistor includes:
    a semiconductor substrate having a main surface;
    a well region of a first conductivity type formed over the main surface;
    a plurality of first impurity regions of a second conductivity type, each of which is formed over the main surface in the well region and from each of which a source electrode is extracted; and
    a second impurity region of a second conductivity type formed over the main surface so as to be adjacent to each of the first impurity regions, from which a drain electrode is extracted, and
    wherein the semiconductor device comprises:
    a third impurity region of the first conductivity type formed over the main surface located, in planar view, between a pair of the first impurity regions and in the well region, from which a potential of the well region is extracted, and
    a gate electrode for isolation formed over the main surface between the first impurity region and the third impurity region.

2. The semiconductor device according to claim 1 further comprising a gate electrode formed over the main surface so as to stretch over the first impurity region and the second impurity region, and
    wherein the gate electrode for isolation is formed so as to be integrated with the gate electrode.

3. The semiconductor device according to claim 2,
    wherein the third impurity region is enclosed by the gate electrode for isolation and the gate electrode.

4. A semiconductor device comprising a high voltage tolerant transistor,
    wherein the high voltage tolerant transistor includes:
    a semiconductor substrate having a main surface;
    a well region of a first conductivity type formed over the main surface:
    the first impurity regions of a second conductivity type, each of which is formed over the main surface in the well region and from each of which a source electrode is extracted; and
    a second impurity region of a second conductivity type formed over the main surface so as to be adjacent to the first impurity regions, from which a drain electrode is extracted, and
    wherein the semiconductor device comprises:
    a third impurity region of the first conductivity type formed over the main surface located, in planar view, between a pair of the first impurity regions and in the well region, from which a potential of the well region is extracted; and
    an insulating film for isolation formed over the main surface located between the first impurity region and the third impurity region, and
    wherein the insulating films for isolation are arranged to be spaced apart from each other in a direction intersecting, in planar view, with a direction along which the first impurity region and the second impurity region are brought together.

5. The semiconductor device according to claim 4 further comprising a gate electrode formed over the main surface so as to stretch over the first impurity region and the second impurity region, wherein the third impurity region is enclosed by the insulating film for isolation and the gate electrode.

6. The semiconductor device according to claim 1, wherein the first impurity region and the second impurity region are n-type impurity regions.

7. The semiconductor device according to claim 1, wherein the well region located, in planar view, between a pair of the first impurity regions contacts the first impurity region.

\* \* \* \* \*